(12) United States Patent
Takahashi et al.

(10) Patent No.: US 11,049,687 B2
(45) Date of Patent: Jun. 29, 2021

(54) STAGE APPARATUS AND CHARGED PARTICLE BEAM APPARATUS

(71) Applicant: HITACHI HIGH-TECHNOLOGIES CORPORATION, Tokyo (JP)

(72) Inventors: Motohiro Takahashi, Tokyo (JP); Masaki Mizuochi, Tokyo (JP); Shuichi Nakagawa, Tokyo (JP); Tomotaka Shibazaki, Tokyo (JP); Naruo Watanabe, Tokyo (JP); Hironori Ogawa, Tokyo (JP); Takanori Kato, Tokyo (JP); Akira Nishioka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/683,340

(22) Filed: Nov. 14, 2019

(65) Prior Publication Data
US 2020/0176217 A1 Jun. 4, 2020

(30) Foreign Application Priority Data

Dec. 4, 2018 (JP) .............................. JP2018-227590

(51) Int. Cl.
*H01J 37/20* (2006.01)
*G01C 9/06* (2006.01)

(52) U.S. Cl.
CPC ................ *H01J 37/20* (2013.01); *G01C 9/06* (2013.01); *G01C 2009/066* (2013.01); *H01J 2237/20207* (2013.01); *H01J 2237/20292* (2013.01)

(58) Field of Classification Search
CPC ............. H01J 37/20; H01J 2237/20221; H01J 2237/20285; H01J 2237/20292;
(Continued)

(56) References Cited

U.S. PATENT DOCUMENTS

| 7,499,180 B2 | 3/2009 | Hattori |
| 2002/0109850 A1* | 8/2002 | Takai ................... G01B 11/028 356/500 |

(Continued)

FOREIGN PATENT DOCUMENTS

| JP | 3890233 B2 | 3/2007 |
| TW | 513555 B | 12/2002 |

(Continued)

OTHER PUBLICATIONS

Taiwanese Office Action received in corresponding Taiwanese Application No. 108135439 dated Jun. 11, 2020.

*Primary Examiner* — David A Vanore
(74) *Attorney, Agent, or Firm* — Mattingly & Malur, PC

(57) ABSTRACT

A stage includes a sample table on which a sample is placed, a first drive mechanism moving the sample table in a first direction; a position measurement element measuring a position in the first direction that is a driving direction of the sample table. The stage also has a scale element having a scale measurement axis that is parallel to a first measurement axis in the first direction based on the position measurement element and is different from the first measurement axis in height, and measuring the position of the sample table in the first direction. A controller calculates the orientation of the sample table by using a measurement value by the position measurement element and a measurement value by the scale element and correcting the Abbe error of the sample table.

11 Claims, 22 Drawing Sheets

(58) Field of Classification Search
CPC ... H01J 2237/20228; H01J 2237/20207; H01J 37/28; H01L 21/68; H01L 21/68785; G01C 9/06; G01C 2009/066; G01B 9/02031; G01B 9/02061; G01B 9/02027
USPC .............................. 250/440.11, 441.1, 453.1
See application file for complete search history.

(56) References Cited

U.S. PATENT DOCUMENTS

| | | | | |
|---|---|---|---|---|
| 2003/0133125 A1* | 7/2003 | Hattori | ............... | G01B 9/02027 356/500 |
| 2009/0284723 A1* | 11/2009 | Shibazaki | ........... | G03F 7/70775 355/53 |
| 2013/0342827 A1* | 12/2013 | Ummethala | ........ | G03F 7/70716 356/72 |
| 2014/0312246 A1* | 10/2014 | Takahashi | ............... | H01J 37/20 250/453.11 |
| 2015/0248991 A1* | 9/2015 | Ogawa | ............... | G01B 9/02027 250/491.1 |
| 2016/0284506 A1* | 9/2016 | Ogawa | .................... | H01J 37/20 |
| 2018/0247855 A1* | 8/2018 | Takahashi | ............... | H01J 37/26 |
| 2019/0103246 A1* | 4/2019 | Takahashi | ............... | H01J 37/20 |
| 2019/0108970 A1* | 4/2019 | Kato | ....................... | H01J 37/22 |
| 2019/0228947 A1* | 7/2019 | Takahashi | ............. | F16C 29/004 |
| 2019/0252151 A1* | 8/2019 | Kato | ........................ | H01J 37/20 |
| 2019/0259567 A1* | 8/2019 | Takahashi | ............... | H01J 37/20 |
| 2019/0311876 A1* | 10/2019 | Shigeoka | ............... | G05D 19/02 |
| 2019/0378678 A1* | 12/2019 | Nishioka | ............... | H01J 37/20 |

FOREIGN PATENT DOCUMENTS

| | | |
|---|---|---|
| TW | I585804 B | 6/2017 |
| WO | 2009/133702 A1 | 11/2009 |

* cited by examiner

STAGE APPARATUS AND CHARGED PARTICLE BEAM APPARATUS

CROSS-REFERENCE TO RELATED APPLICATION

The present application claims priority from Japanese application JP 2018-227590, filed on Dec. 4, 2018, the contents of which is hereby incorporated by reference into this application.

BACKGROUND OF THE INVENTION

1. Field of the Invention

The present disclosure relates to a stage apparatus and a charged particle beam apparatus.

2. Description of the Related Art

In a charged particle beam apparatus such as an electronic microscope used for manufacturing, measurement, test, and so forth of semiconductor wafers, a stage that moves the position of a sample is disposed in order to irradiate a desired position on the sample with a beam. Such a stage is equipped with a drive mechanism for moving the sample at least in two directions in order to move the sample in two-dimensional directions. Furthermore, it is general that a laser interferometer is used for position measurement of the stage.

For example, in Japanese Patent No. 3890233, hereinafter, patent document 1, a stage apparatus that measures the tilt of a table and corrects a measurement error according to the inclination is disclosed. Specifically, in patent document 1, in addition to an interferometer that measures the horizontal-direction position of a mirror fixed to the table, two interferometers for measuring two points between which an interval is set in the height direction to measure the tilt of the mirror are disposed. According to such a configuration, in the stage that operates in the horizontal plane, in two axes of XY, a measurement error or Abbe error accompanying the inclination of the stage can be reduced.

However, in the case of attempting to reduce the Abbe error, the related art shown in patent document 1 involves various problems. For example, an interferometer for tilt measurement needs to be disposed in addition to an interferometer for position measurement, and the cost of the length measurement system becomes twice and the apparatus cost increases. Furthermore, for tilt measurement, two points different in the height on a mirror need to be measured and the mirror height needs to be enlarged. Moreover, two interferometers need to be laterally arranged and the length of the mirror also increases. In addition, in the case of a stage for which positioning is carried out also in the vertical direction or Z-direction, the height of the mirror needs to be further enlarged according to the movable stroke in the Z-direction. Due to the enlargement of the mirror, vibration of the mirror attributed to stage movement increases in addition to increase in the manufacturing cost of the mirror and the table. Moreover, motor heat generation increases due to increase in the movable mass, which leads to increase in the positioning error attributed to thermal deformation.

The present disclosure is made in view of such circumstances and provides a technique for implementing achievement of both of reduction in the Abbe error and reduction in the weight of a mirror.

SUMMARY OF THE INVENTION

In order to solve the above-described problems, the present disclosure proposes, as one aspect, a stage apparatus including: a sample table on which a sample is placed; a first drive mechanism moving the sample table in a first direction; a position measurement element measuring a position in the first direction that is a driving direction of the sample table; a scale element having a scale measurement axis that is parallel to a first measurement axis in the first direction based on the position measurement element and is different from the first measurement axis in height, and measuring the position of the sample table in the first direction; and a controller calculating the orientation of the sample table by using a measurement value by the position measurement element and a measurement value by the scale element and correcting the Abbe error of the sample table.

Further features relating to the present disclosure will become clear from description of the present specification and accompanying drawings. Furthermore, aspects of the present disclosure are achieved and implemented based on elements, combinations of a wide variety of elements, and the following detailed description and modes of the attached scope of claims.

It needs to be understood that the description of the present specification is merely typical exemplification and does not limit the scope of claims or application examples in the present disclosure in any meaning.

According to the present disclosure, it becomes possible to implement achievement of both of reduction in the Abbe error and reduction in the weight of a mirror in a stage apparatus and a charged particle beam apparatus.

DESCRIPTION OF THE PREFERRED EMBODIMENTS

Figure 1:
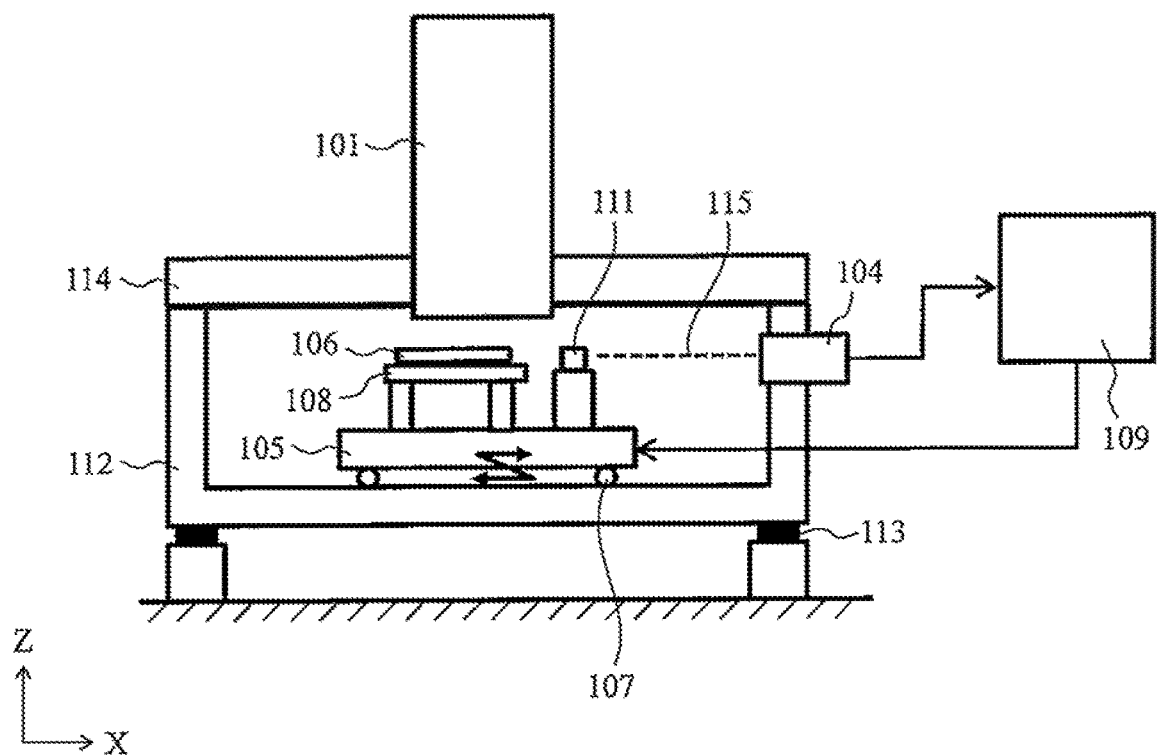
FIG. 1 is a diagram depicting the configuration of a charged particle beam apparatus.

The present embodiment discloses a technique for correcting a positioning error due to the Abbe error regarding a stage apparatus used in a charged particle beam apparatus and so forth.

A detailed description will be made below about achievement of both of reduction in the Abbe error and prevention of increase in the apparatus scale by the present embodiment. Prior to this, first, the cause of occurrence of the Abbe error and the necessity for reduction in the Abbe error will be described and technical problems will be further highlighted.

<Cause of Occurrence of Abbe Error and Necessity for Reduction in Abbe Error>

In association with miniaturization of semiconductor elements in recent years, enhancement in the positioning accuracy has been requested for not only a manufacturing apparatus but also a test apparatus and a measurement apparatus. For example, for searching for a desired test place, a SEM image of a pattern on a wafer is acquired based on the position coordinates of the stage. Even when a positioning error exists in the stage, as long as the position deviation from the target value of the wafer can be accurately measured, the position deviation of the stage can be corrected by deflecting an electronic beam and a desired pattern can be measured. However, if it is impossible to accurately measure the position deviation from the target value of the wafer, an error occurs in the correction of the electronic beam and thus the position of the desired pattern can not be irradiated with the electronic beam and deviation of the field of view occurs. The distance between the pattern position of the observation target generated in this manner and the irradiation position of the electronic beam with which the irradiation is carried out after the stage position deviation is corrected is referred to as the field-of-view positioning error. As pattern miniaturization of the device progresses to a higher extent, it becomes more difficult to reach the desired test place when the field-of-view positioning error occurs.

Here, if a difference exists between the height of the laser optical axis and the height of the observation surface of the wafer upper surface, the Abbe error occurs according to change in the tilt of a table.

In a charged particle beam apparatus having a stage that can convey a wafer, the Abbe error can be corrected and the field-of-view positioning error can be reduced by carrying out measurement of the tilt of a table, that is, pitching measurement. However, in the case of additionally disposing an interferometer to measure the tilt, the mirror mass and the cost required for it increase correspondingly. Furthermore, in the case of a stage that moves in the Z-direction, enlargement of the mirror height by the Z-axis stroke is necessary and the mirror mass further increases. When the mirror dimensions are enlarged, increase in the size of the table also becomes necessary for supporting the mirror and the movable mass of the stage greatly increases. Due to this, motor heat generation of the stage increases and the field-of-view positioning accuracy deteriorates because of thermal deformation. Moreover, vibration of columns and sample chamber at the time of stage movement increases and extension of the time for waiting for vibration attenuation after the movement becomes necessary, so that the improvement in the throughput becomes difficult. In addition, when the mirror dimensions are enlarged, the sample chamber in which the mirror is housed also needs to be enlarged, which leads also to increase in the apparatus size and increase in the manufacturing cost. In other words, in addition to the arising of the necessity for additional disposing of an interferometer, the influence on other constitutional elements in the stage apparatus is also large.

In contrast, the present embodiment exemplifies a structure in which a linear scale is added to the lower surface of a table in a stage apparatus. In general, the linear scale has smaller size, lighter weight, and low cost compared with the interferometer and enables elimination of the Abbe error without increasing the movable mass and manufacturing cost of the stage. In other words, according to the present embodiment, the Abbe error can be suppressed without increasing the dimensions and movable mass of the stage and, for example, in the case of a charged particle beam apparatus, the field-of-view positioning accuracy can be improved.

Specifically, the present embodiment explains: a stage apparatus that is a sample stage apparatus supporting a sample mainly and including an X-direction-and-Y-direction movement mechanism that moves this sample in the X-direction and the Y-direction or an X-direction movement mechanism that moves this sample in the X-direction, and includes laser interferometers for X-direction and Y-direction measurement and linear scales for X-direction and Y-direction measurement at different heights from the optical axes of the laser interferometers; and a charged particle beam apparatus. According to this configuration, achievement of both of reduction in the weight of the stage and reduction in the field-of-view positioning error is enabled. Technical ideas of the present embodiment can be applied also to a stage apparatus having a positioning mechanism of X-Y-Z-axis directions. In this case, deviation of the field of view due to the Abbe error can be minimized whichever position a Z mechanism is fixed at, and the field-of-view positioning accuracy can be improved.

(1) First Embodiment

A first embodiment is what relates to a stage apparatus having a function of, in an XY stage, or XY table: X-direction-and-Y-direction movement mechanism, measuring the XY positions of the XY stage at different heights from the optical axes of laser interferometers and correcting the Abbe error. In particular, with the XY stage including a general Z mechanism, the difference between the optical axis height of the interferometers that measure positions in the XY directions and the height of a sample positioned by the Z mechanism changes depending on the position of the Z mechanism and thus the Abbe error increases and decreases. Furthermore, in a stage apparatus or a charged particle beam apparatus equipped with a Z stage, when ensuring high positioning accuracy is attempted in both of the case in which a sample is set at a high position and the case in which the sample is set at a low position, the difference in the height between the optical axes of the interferometers and the sample becomes large in either or both of the above-described cases and the Abbe error becomes large. For this reason, it is difficult to set the positioning accuracy high in both cases, or cases in which the sample is placed at both positions of the high position and the low position.

A stage structure according to the present embodiment is characterized by forming a configuration including, besides interferometers that carry out position measurement of the stage, linear scales for tilt measurement each having a measurement axis that is parallel to the interferometer optical axis and is at a different height therefrom. According to this configuration, a stage structure the can measure the tilt and correct the Abbe error whichever height a sample is positioned at by the Z mechanism and has high field-of-view positioning accuracy is provided. The first embodiment will be described in detail below.

Configuration Example of Charged Particle Beam Apparatus

Techniques based on the present disclosure can be applied to a charged particle beam apparatus, for example. Then, with reference to FIG. 1, a configuration example of a charged particle beam apparatus will be described. Here, a semiconductor measurement apparatus or a critical-dimension scanning electron microscope, hereinafter referred to as a critical-dimension SEM, is cited as one example of a charged particle beam apparatus.

The critical-dimension SEM includes an electron optical system lens barrel 101 mounted on a sample chamber 112. The sample chamber 112 is supported by an anti-vibration mount 113. The critical-dimension SEM applies an electronic beam onto a wafer 106 from the electron optical system lens barrel 101 and images a pattern on the wafer 106 to carry out measurement of the line width and evaluation of the shape accuracy regarding the pattern. In the sample chamber 112, a stage, for example XY stage, having a sample table 105 as a movable part is mounted and a chuck 108 on which the wafer 106 that is an observation target is mounted is fixed to the sample table 105. The table, for example table composed of a Y table and an X table placed over it, 105 is configured movably by a drive mechanism such as a linear motor or piezo actuator that is not depicted. In the present embodiment, a description will be made about a stage apparatus including a drive mechanism, or first drive mechanism, that moves a table, for example X table, in the X-direction and a drive mechanism, or second drive mechanism, that moves a table, for example Y table, in the Y-direction.

Furthermore, the sample table 105 is supported by a guide 107. The position of a mirror 111 is measured to obtain the stage coordinates by a laser interferometer 104 and positioning control of the sample table 105 is carried out by a controller 109, or a control apparatus. The controller 109 supplies a signal for driving an XY stage mechanism, or first and second drive mechanisms, as described later.

In such a critical-dimension SEM, for example, when the reproducibility exists in deviation between the laser length measurement value and the image, it is possible to create a correction map by recording the deviation amount of the image with respect to the coordinates and correct the deviation amount of the image. Specifically, when the electronic beam is shifted by the amount obtained by adding the deviation amount of the image on this correction map to the difference between the present position measurement value of the stage and the target position, the field-of-view positioning error attributed to change in the table orientation with reproducibility can be set to a value close to 0. However, in the case in which reproducibility does not exist in the orientation change of the table or a component without reproducibility is mixed therein, or the like, the field-of-view positioning error is often left even when the correction map is used. In particular, for measuring a device in which the pattern interval is several nanometers, this field-of-view positioning error needs to be reduced to the limit.

<Relationship between Orientation Error of Table and Field-of-view Positioning Error>

Figure 2:
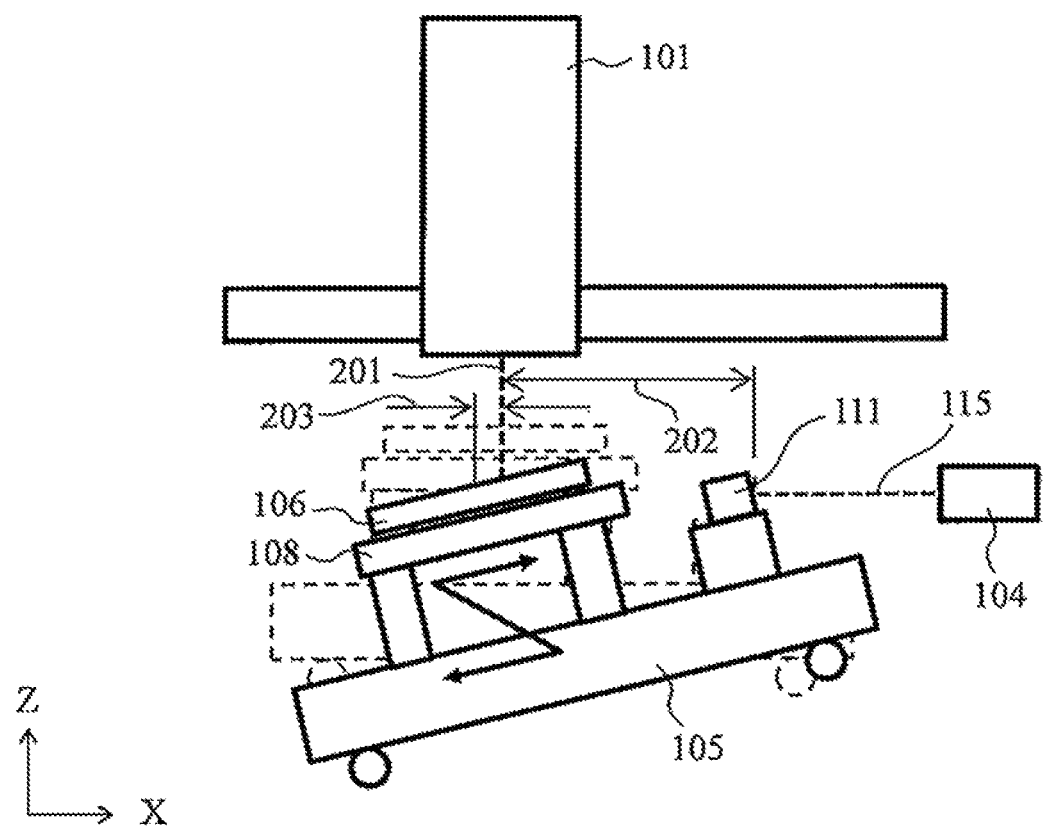
FIG. 2 is a diagram for explaining a positioning error due to the tilt of a table.

FIG. 2 is a schematic diagram for explaining that the orientation error of the table leads to the field-of-view positioning error. FIG. 2 depicts the case in which the sample table 105 is tilted from the state in which the center of the wafer 106 is irradiated with an electronic beam 201. When the sample table 105 is tilted, relative distance 202 between the mirror 111 and the electronic beam 201 in the X-axis direction changes and a change arises in the relative distance between the mirror 111 and the observation point in the X-axis direction, resulting in a position deviation 203, that is, deviation of the field of view or image deviation. When the tilt of the sample table 105 changes in this manner, the distance between the mirror 111 and the observation target point in the horizontal direction changes, and the change becomes the field-of-view positioning error.

<Principle of Occurrence of Abbe Error>

Figure 3:
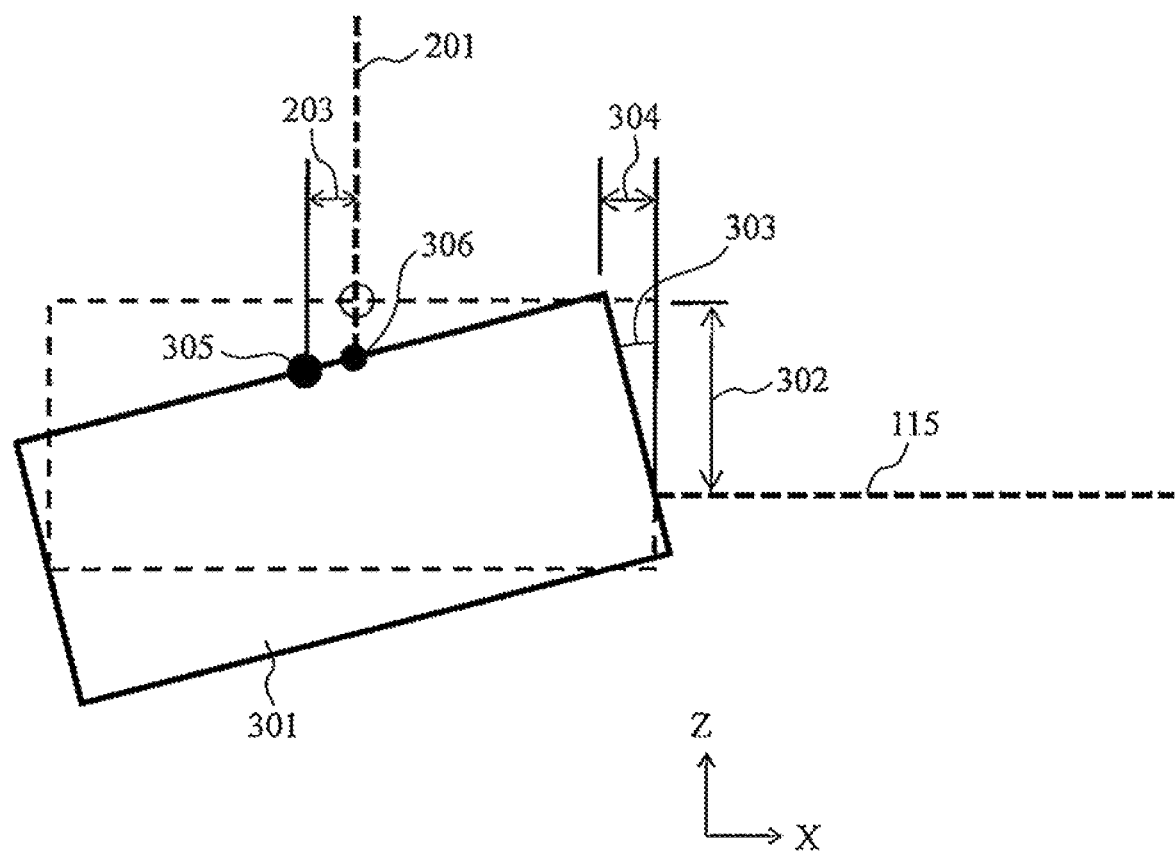
FIG. 3 is a diagram for explaining the principle of occurrence of the Abbe error.

FIG. 3 is a diagram for explaining the principle of occurrence of the Abbe error. Here, the sample table 105, the sample or wafer 106, and the mirror 111 are modeled as a rigid body formed of one rectangular parallelepiped, or measurement-and-observation target, 301.

In FIG. 3, when the difference in the height between a laser optical axis 115 and the sample observation point is defined as A, or height 302: Abbe offset in FIG. 3, and the tilt of the table is defined as $\varphi$, or tilt 303 in FIG. 3, position deviation D, or position deviation 203 in FIG. 3, of the observation point due to the tilt of the sample table 105 is represented as $D = A \cdot \varphi$.

In other words, if the tilt is constant, the position deviation "D 203" becomes larger in proportion to the difference in the height "A 302." On the other hand, if the height of the observation surface and the height of the laser optical axis 115 can be set equal and the difference 302 in the height can be set to 0, the position deviation 203 due to the tilt can be set to 0. For example, when the Abbe error is desired to be set equal to or smaller than 1 nm, the tilt needs to be set to approximately 0.1 arcsecond and the difference in the height needs to be set equal to or smaller than approximately 2 mm.

<Problems of Interferometer Addition System>

Figure 4A:
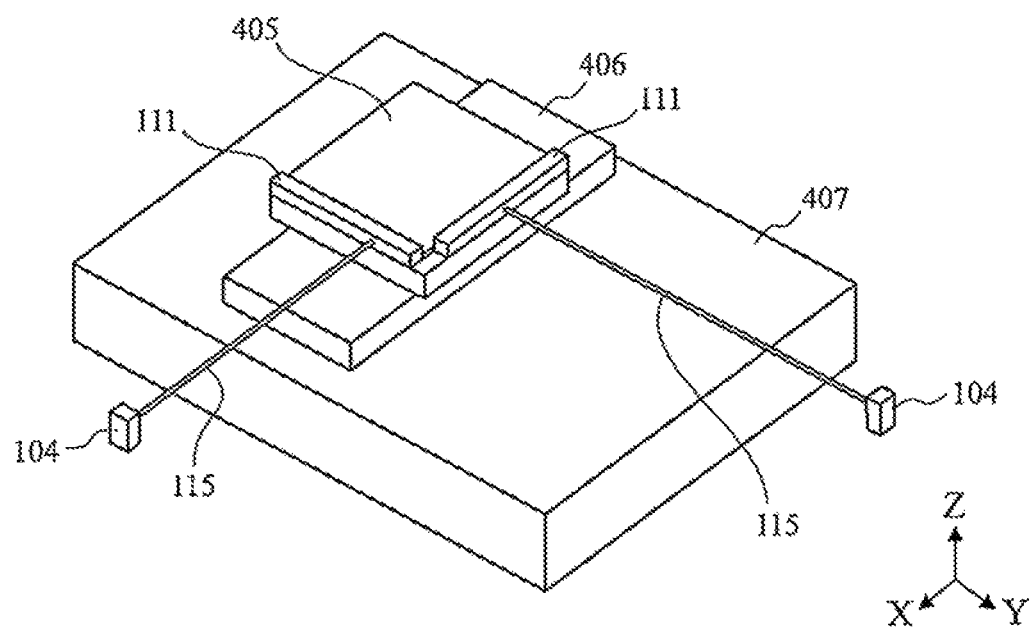
FIGS. 4A and 4B are diagrams for explaining a configuration that measures the tilt of the table by using interferometers.
Figure 4B:
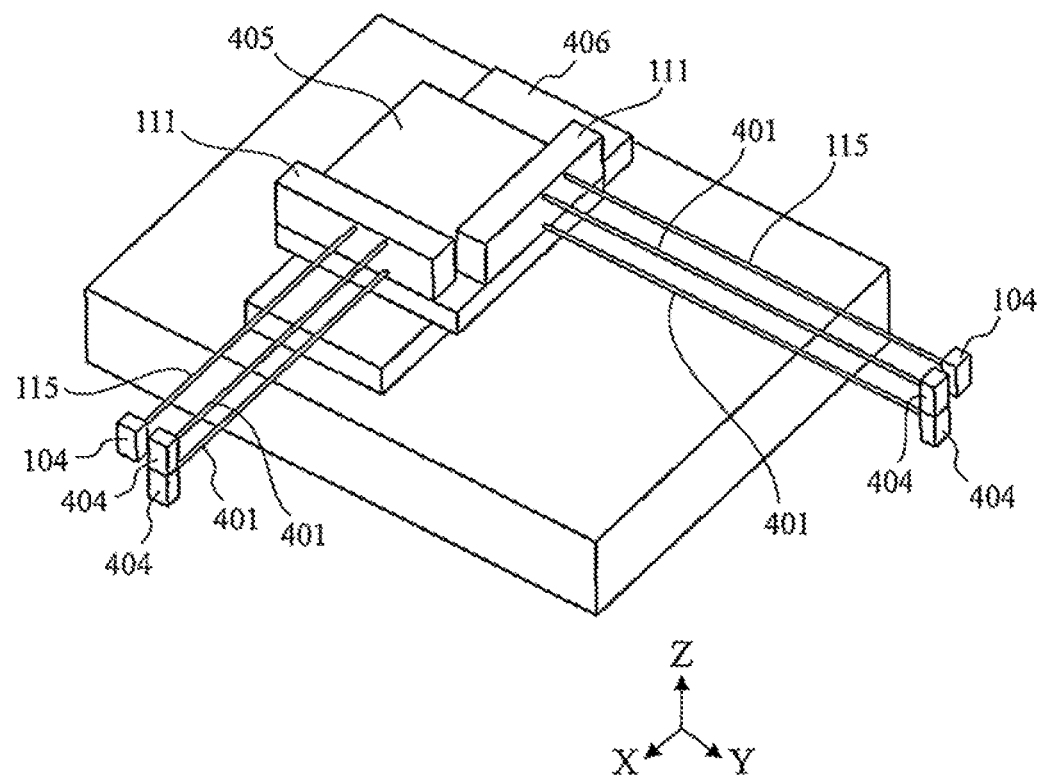

To measure the Abbe error, an interferometer is additionally disposed, by using the interferometer addition system, according to the existing configuration example such as a technique disclosed in patent document 1. Here, a discussion will be made about problems of the interferometer addition system. FIGS. 4A and 4B are diagrams for explaining the problems of the interferometer addition system that is a representative publicly-known example to carry out tilt measurement of the table.

In a stage depicted in FIG. 4A, the positions of an X table 405 and a Y table 406 are measured by the laser interferometers 104. However, in this configuration, the tilt of the table can not be measured.

In contrast, in a stage depicted in FIG. 4B, laser interferometers 404 are added, and the tilt of the mirror 111 is obtained based on the difference between measurement values by two laser beams of an optical axis 401 and an optical axis 401', and this tilt is employed as the tilt of the table, by using the interferometer addition system. In this system, there are problems that addition of expensive interferometers is necessary and enlargement of the length and height of the mirror 111 is necessary, resulting in cost increase and vibration increase.

Figure 5A:
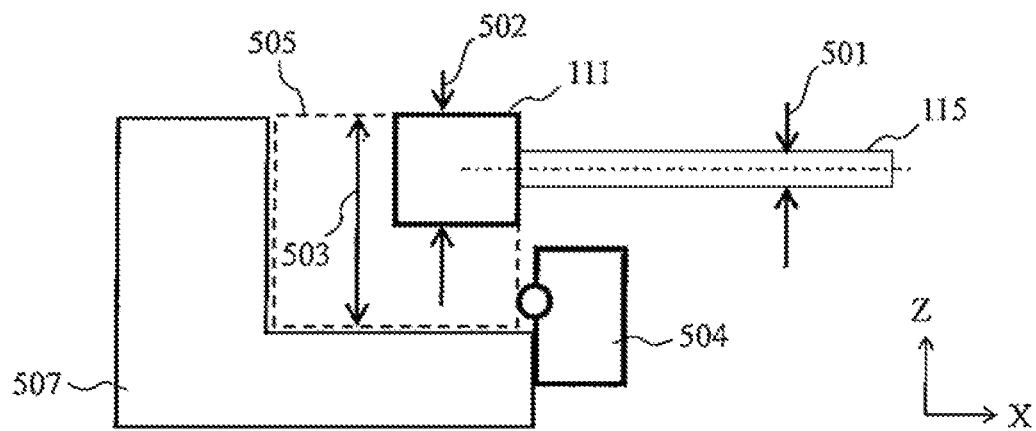
FIGS. 5A and 5B are diagrams for explaining enlargement of a mirror when the interferometers are used.
Figure 5B:
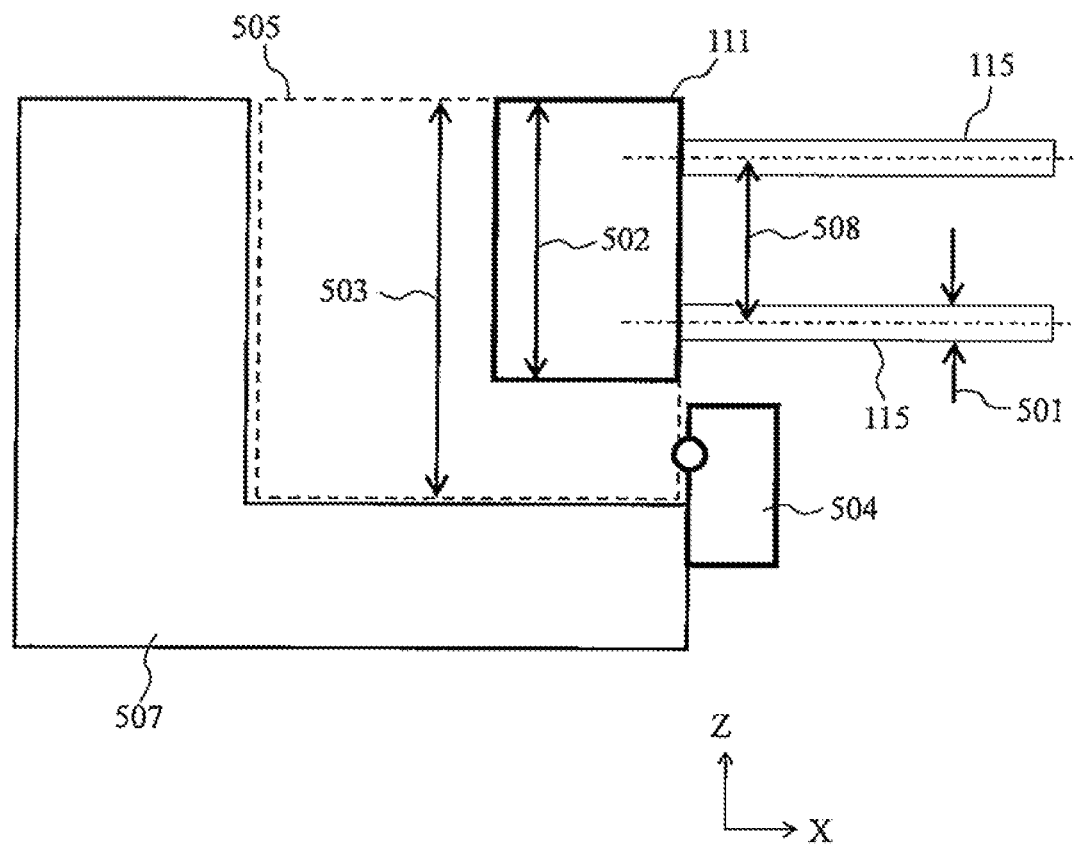

Here, the reason why the enlargement of the height of the mirror 111 is necessary will be mentioned in detail. FIGS. 5A and 5B are diagrams for specifically explaining the reason why the enlargement of the height of the mirror 111 is necessary in the interferometer addition system depicted in FIG. 4B.

FIG. 5A is a section of the X-axis bar mirror at XZ plane when only the position in FIG. 4A is measured. Referring to FIG. 5A reveals that necessary height 502 of the effective surface of the mirror 111 depends on diameter 501 of the laser beam. Furthermore, it turns out that the entire height dimension 503 of the mirror 111 depends on the dimensions of a component 504 for mirror fixing.

On the other hand, FIG. 5B is a section of the X-axis bar mirror at XZ plane when the table tilt is measured by the interferometers of FIG. 4B. In this case, the necessary height 502 of the mirror effective surface depends on the diameter 501 of the laser beam and interval 508 between the laser beams of the interferometers. The effective range "height 502" of the mirror 111 becomes large compared with the case of FIG. 5A, and enlargement of the height 503 of the mirror 111 is necessary in dimensions 505 of the mirror 111. Furthermore, the thickness in the X-direction also becomes larger for ensuring of the rigidity at the time of mirror polishing. Due to this, a mirror support part 507 of the table of the stage also has to be enlarged. Thus, vibration of the mirror increases and the mass of the table also increases.

Figure 6:
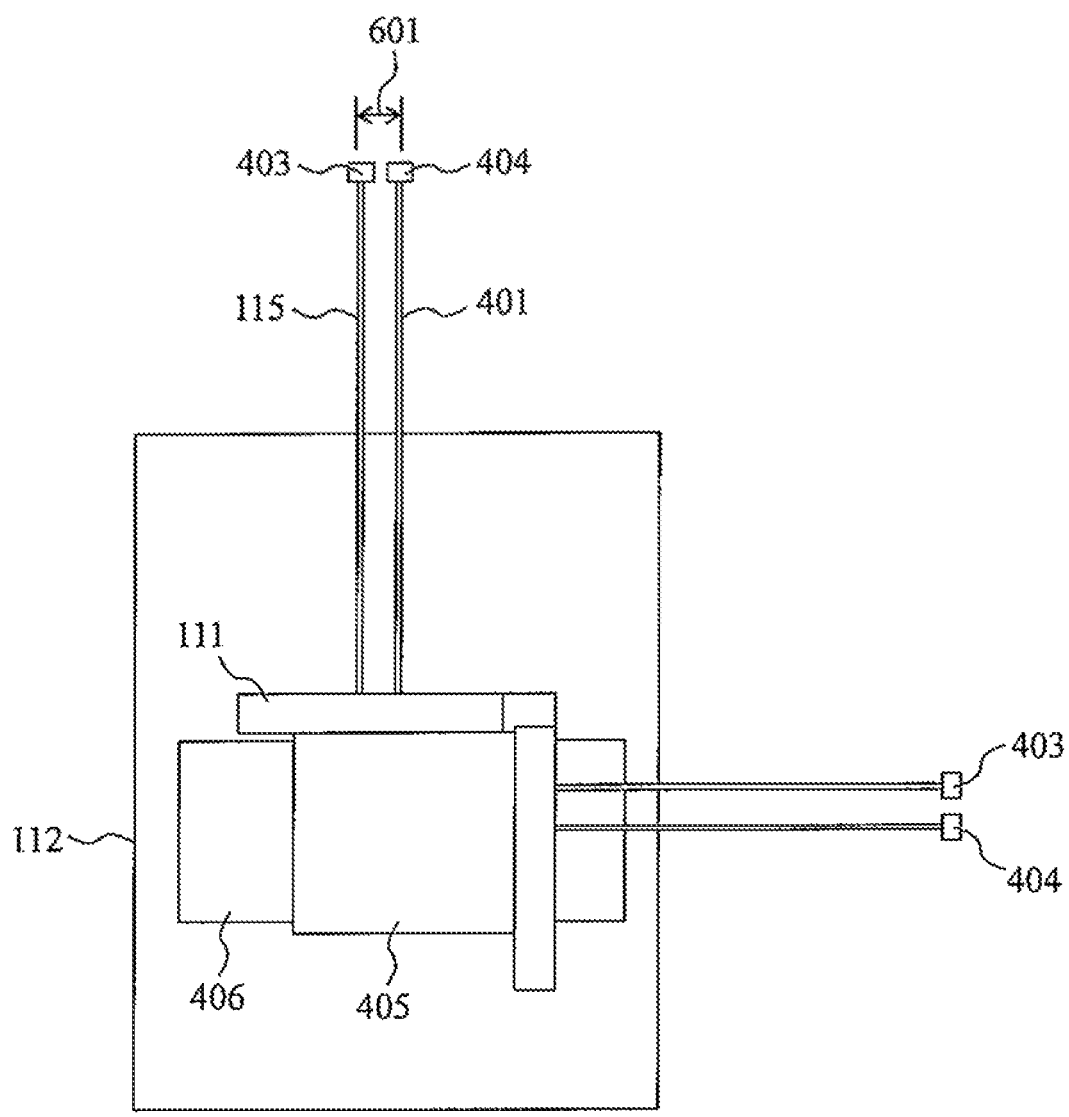
FIG. 6 is a diagram for explaining extension of the mirror when the interferometers are used.

Moreover, the reason why the enlargement of the length of the mirror 111 is necessary will also be mentioned. FIG. 6 is a diagram for specifically explaining the reason why the enlargement of the length of the mirror 111 is necessary.

Referring to FIG. 6, when the table tilt is measured by interferometers, an interferometer 403 for position measurement and the interferometer 404 for tilt measurement are disposed adjacent to each other and therefore the length of the mirror 111 needs to be extended corresponding to disposing interval 601 between the interferometers 403 and 404. Due to this, to stably support the mirror 111, the area of the top table 405, referred to also as X table, needs to be enlarged and, in association with this, the area of the Y table 406 needs to be enlarged, causing increase in the movable mass. Furthermore, when the length of the mirror 111 is extended, enlargement of the sample chamber 112 also becomes necessary for avoidance of interference with the sample chamber 112 and increase in the apparatus manufacturing cost and the footprint is caused.

Figure 7:
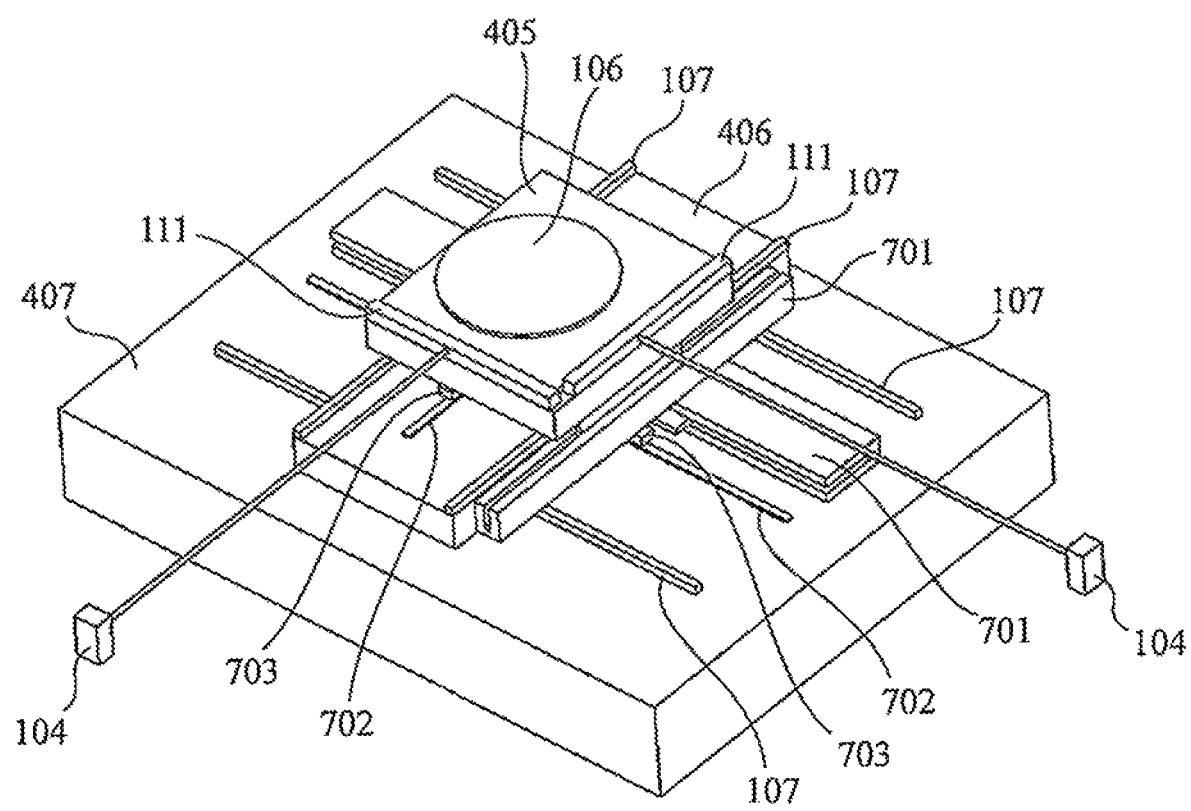
FIG. 7 is a diagram for explaining a configuration that measures the tilt by using the interferometers and scales.

Configuration Example to Implement Achievement of Both of Reduction in Abbe Error and Reduction in Weight of Mirror FIG. 7 is a diagram depicting a configuration example of the stage apparatus according to the present embodiment. In the stage apparatus depicted in FIG. 7, the Y table 406 of the sample table 105 is mounted over a sample chamber bottom surface 407 and the top table 405 of the sample table 105 is mounted over it and the wafer 106 is mounted thereon. The position of each table is measured by the laser interferometer 104. Furthermore, the position of each table is measured by linear scales 702 fixed onto the sample chamber bottom surface 407 and the Y table 406 and a scale head 703 attached to each of the bottom surface of the Y table 406 and the bottom surface of the top table 405, or X table. Then, the orientation of the table is calculated by using the table position measured by the laser interferometers 104 and the table position measured by the scales 702. Here, the measurement axes of the laser interferometers and the scales need to be parallel to the X-direction or the Y-direction and have an interval in the Z-direction.

As above, in the present embodiment, without additionally disposing interferometers as in the existing example, the tilt or Abbe error, of each table is measured through additional disposing of the linear scales 702 and the scale heads 703. By employing such a configuration to measure the Abbe error and correct the measured Abbe error, it becomes possible to achieve both of a task of reduction in the Abbe error and a task of reduction in the weight of the mirror and prevention of increase in the scale of the stage apparatus. The measurement of the Abbe error will be described in detail below.

<Orientation Detection Using Scales>

Figure 8A:
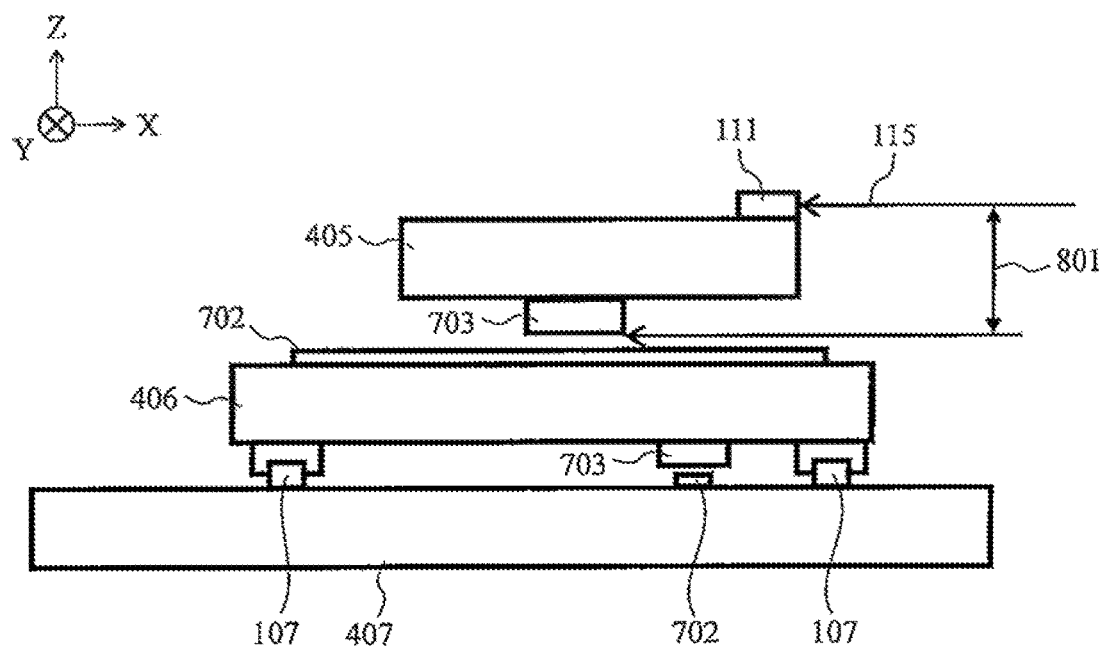
FIGS. 8A and 8B are diagrams for explaining the principle of tilt measurement using the interferometer and the scale.
Figure 8B:
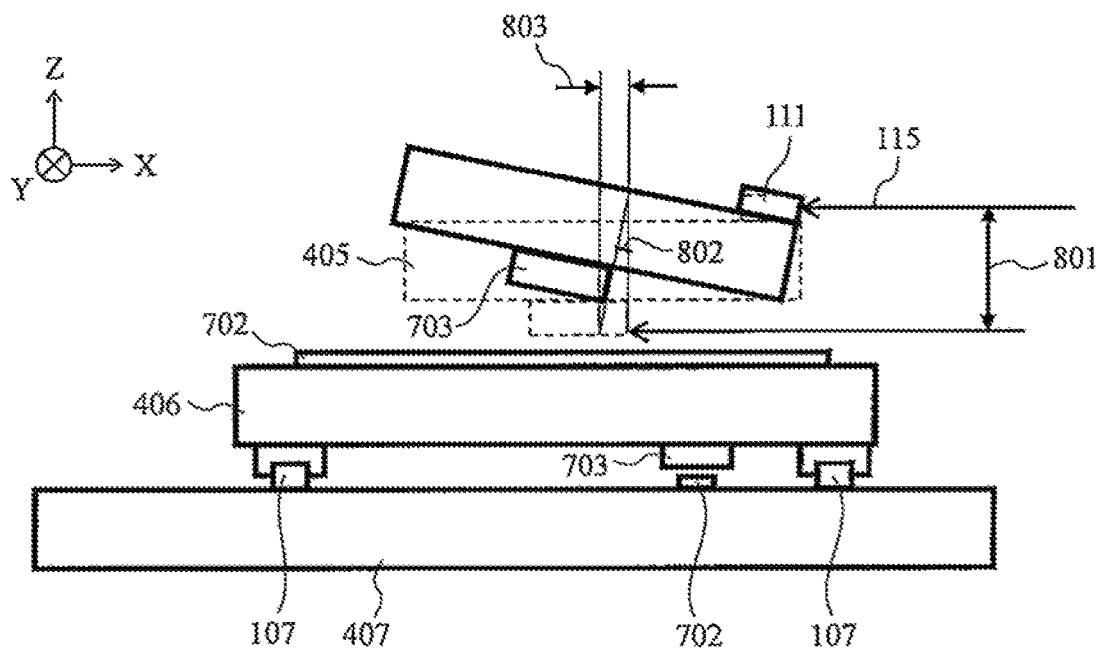

FIGS. 8A and 8B are conceptual diagrams for explaining an orientation detection method using scales according to the present embodiment.

In FIG. 8A, a difference 801 in the height between the laser interferometer optical axis 115 and the measurement axis of the scale 702 is defined as L. Furthermore, a consideration will be made about the case in which the top table 405 is tilted as in FIG. 8B. When a tilt 802 of the top table 405 relative to the Y table 406 is defined as θy, a change 803 in the scale value occurs with respect to the same laser value. When this difference between the scale and the laser value is defined as E, a relationship represented by expression (1) holds.

$$E = L \cdot \theta y \tag{1}$$

Expression (2) can be derived from expression (1).

$$\theta y = E/L \tag{2}$$

The tilt θy of the table is obtained from expression (2). When the Abbe error explained by using FIG. 2 and FIG. 3 is obtained from this tilt θy, the position deviation between the laser value and the wafer observation point, i.e. deviation of the field of view, can be corrected.

<Details of Tilt Detection of Table: Existing Example in Which Only Interferometer Is Used, and Present Embodiment in which Interferometer and Linear Scale are Used)>

Figure 9A:
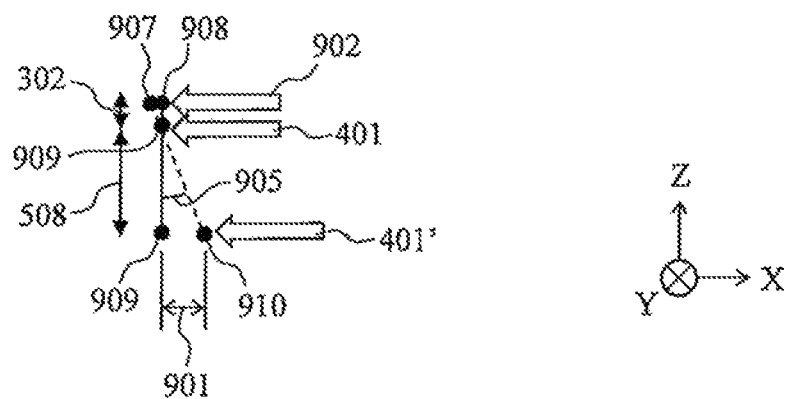
FIGS. 9A and 9B are diagrams for explaining an advantage of the tilt measurement using the interferometer and the scale.
Figure 9B:
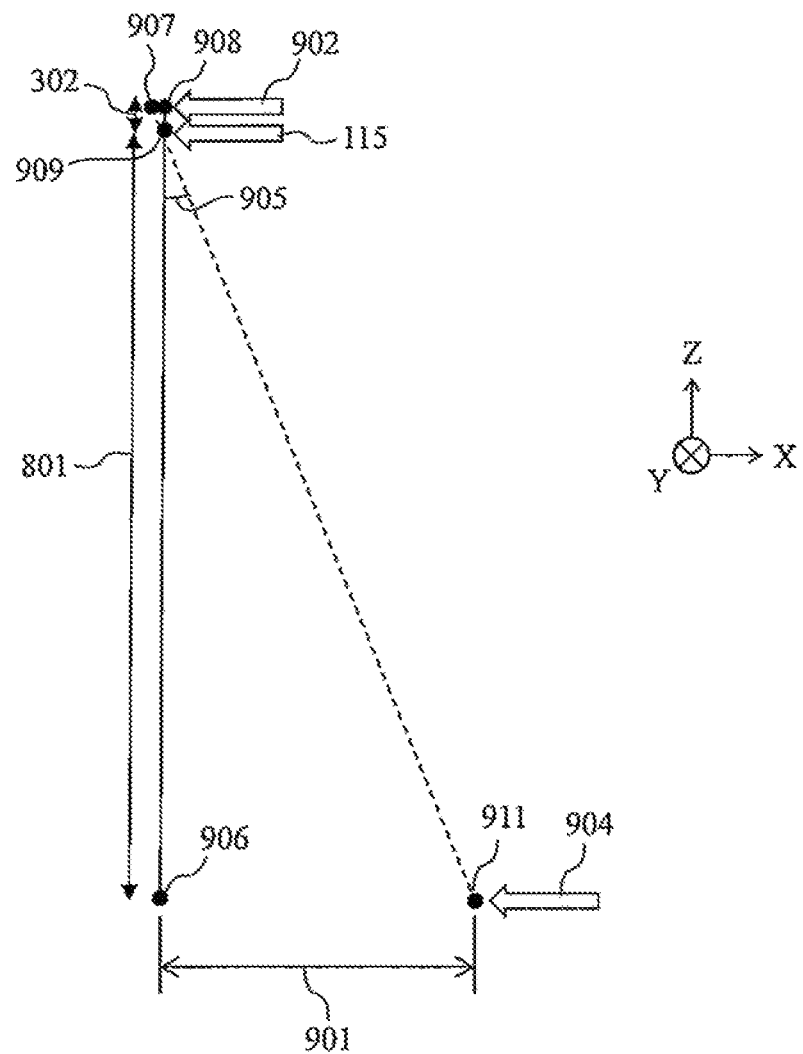

FIGS. 9A and 9B are diagrams for explaining an advantage of the tilt detection method using the laser and the scale according to the present embodiment. FIGS. 9A and 9B represent the relationship between the Abbe error and the measurement value of the sensor when the same pitching, that means forward-leaning of the table with respect to the traveling direction, has occurred. FIG. 9A depicts the case of the interferometer addition system and FIG. 9B depicts the case of the scale combining system of the present embodiment.

As depicted in FIG. 9A, in the case of tilt measurement using the laser interferometers 104 and 404, due to generation of a tilt angle 905, that is equivalent to the tilt 802 in FIG. 8B, of the top table 405, a measurement position 909 or measurement point of the lower-side laser, measurement axis or optical axis 401', from the laser interferometer 404 moves to a position or laser length measurement point 910. Due to this, a difference or change 901 in the scale value of the laser value is generated with respect to the measurement position 909 obtained by the measurement axis or optical axis 401' of the laser interferometer 404. A measurement axis 902 represents the height of the wafer read by the critical-dimension SEM.

Here, when the difference or change 901 in the scale value is defined as E1 and the interval 508 between the upper and lower laser beams of the interferometers 404 is defined as L1 and the difference in the height between the upper-side laser beam and the wafer 106 is defined as L2, the interval between an observation point or position 908 of observation target and an observation point 907 after the movement due to the tilt angle 905, i.e. deviation E2 of the field of view, can be obtained as represented by expression (3).

$$E1/L1=E2/L2 \qquad (3)$$

Furthermore, expression (4) is derived from expression (3).

$$E2=E1 \cdot L2/L1 \qquad (4)$$

Even when noise exists in the laser measurement value of E1, the influence of the noise of E1 on the measurement value of E2 is small if L1 can be set long. However, to enlarge L1, enlargement of the mirror height 502 is necessary. Thus, doing so is difficult in terms of the mass of the movable part and the apparatus cost. For this reason, in the existing example, the laser interferometer 404 that measures E1 needs to have high resolution and high accuracy, so that possibly the cost becomes higher.

On the other hand, in the scale combining system of FIG. 9B according to the present embodiment, a difference 801 "L1" in the height between the scale 702 and the laser optical axis 115 of the laser interferometer 104 can be ensured as a large difference. Therefore, with the slight tilt angle 905, the difference or change 901 in the scale value of the scale as E1 appears as a large difference. In other words, even when noise or an error exists in E1, E2 is obtained with high accuracy and high resolution because L is large. Furthermore, in general, the linear scale is inexpensive compared with the interferometer and is advantageous also in terms of the apparatus cost.

<Error Due to Yawing>

Figure 10A:
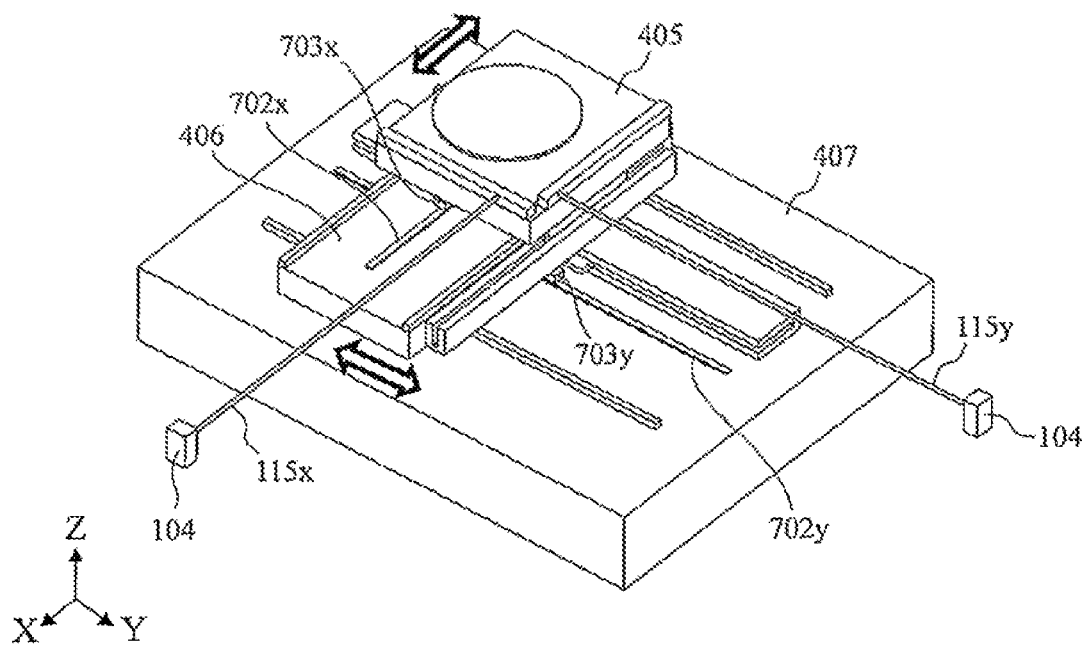
FIGS. 10A and 10B are diagrams when the positions of an X-axis scale and an X laser optical axis are deviated.

FIG. 10A is a diagram for explaining that an error occurs due to yawing or rotation around the Z-axis of the top table 405 when the laser optical axis 115 and the scale 702 are deviated from each other.

Figure 10B:
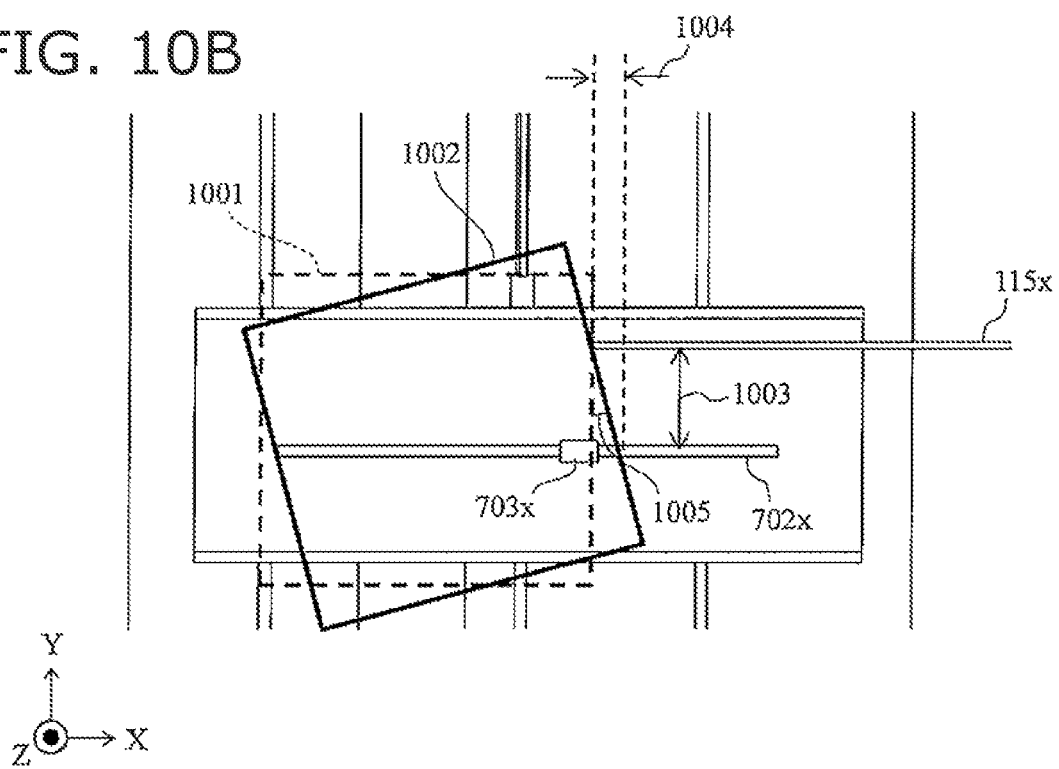

As depicted in FIG. 10B, when the positions of a laser optical axis 115x and a scale 702x are deviated from each other by a distance 1003, in the system of FIG. 7, an error E 1004 often occurs in measurement of pitching "θy rotation" due to yawing "θz rotation" of the top table 405. When the distance 1003 is defined as L3, this error E can be represented as expression (5).

$$E=\theta z \cdot L3 \qquad (5)$$

When L3 is short or when yawing θz is small, the error E becomes minute and thus θz does not need to be considered. Therefore, the tilt measurement is possible even with the configuration of FIG. 7.

<Influence of Position Deviation between Scale and Laser Optical Axis>

Figure 11:
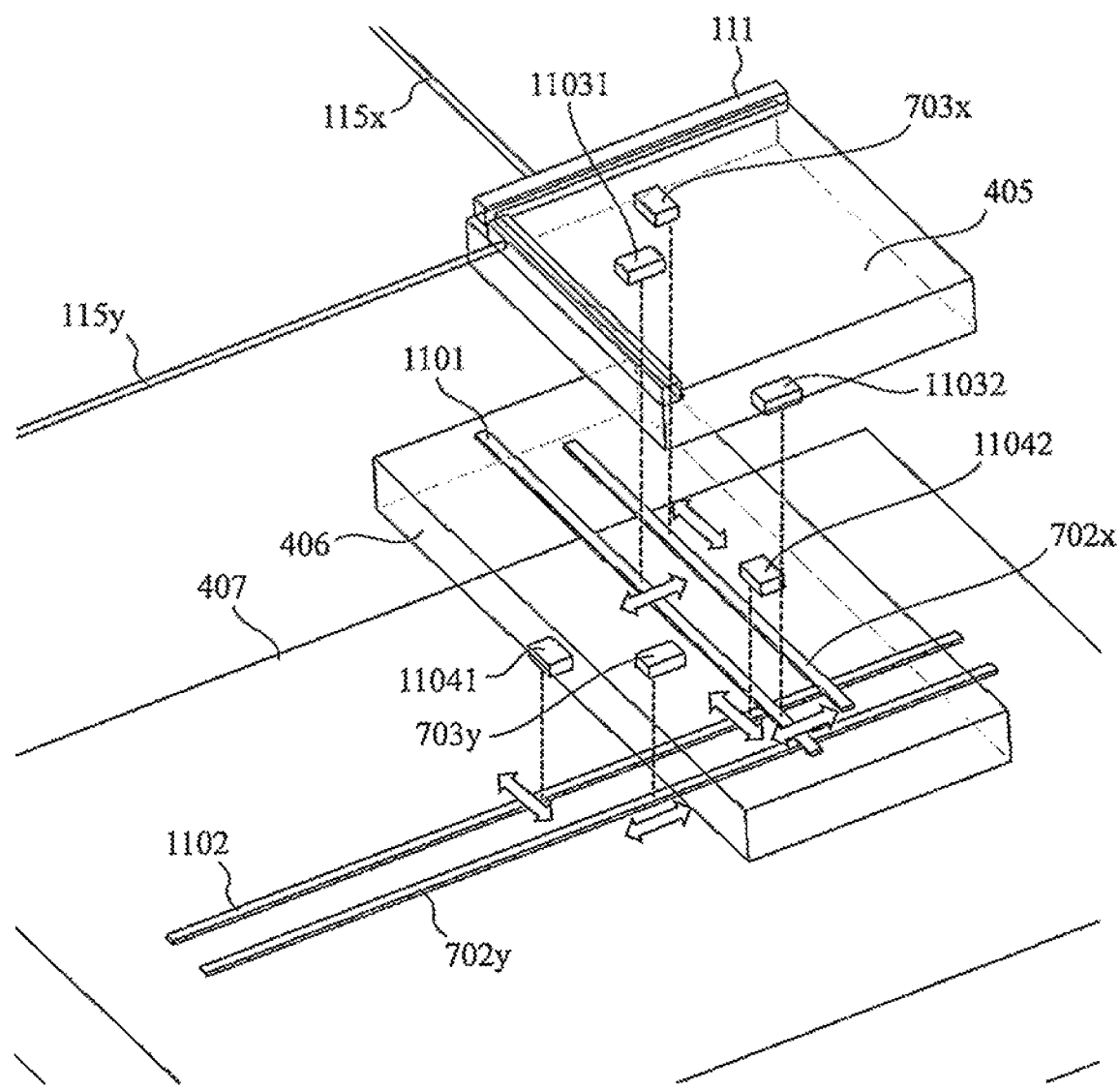
FIG. 11 is a diagram depicting a configuration example when perpendicular axis scales are added.

FIG. 11 is a diagram for explaining a method for measuring a tilt with high accuracy even when the measurement position by the scale and the measurement position by the interferometer are deviated from each other. In the configuration depicted in FIG. 7, in which one set of scale and scale head for each table are provided, when the deviation between the measurement position of the top table 405 by the laser interferometer 104 or optical axis 115x, and the measurement position by the scale 702x or position deviation L3: distance 1003 is large, or when the yawing θz is large, the error E becomes large, see expression (5), and the accuracy of pitching measurement is lowered. Then, to address such a situation, as depicted in FIG. 11, a perpendicular axis scale 1101 for the X-axis and a perpendicular axis scale 1102 for the Y-axis that measure displacement in the direction perpendicular to the driving direction may be added, that is, two sets of scale and scale head may be added for each table. The perpendicular axis scale 1101 for the X-axis measures the displacement of the top table 405 in the Y-direction and the perpendicular axis scale 1102 for the Y-axis measures the displacement of the Y table 406 in the X-direction. Due to this, position deviation of the scale 702x in the X-direction by yawing can be corrected, and pitching can be obtained by taking the difference between the position measured by the laser interferometer 104, or laser optical axis 115x, that measures the distance in the X-axis direction and the measurement value of the corrected scale 702x. Furthermore, rolling (θx) that means motion of tilting of the table in the lateral direction can be obtained from the difference between the measurement position of the X table 405 by the other interferometer, or optical axis 115y, and the measurement position by the perpendicular axis scale 1101 for the X-axis regarding the table in the direction, or Y-direction, perpendicular to the movement direction of the X table 405, or X-direction.

By the above-described method, the tilt "θx and θy" of the top table 405, or X table, relative to the Y table 406 can be obtained.

Similarly, also regarding the Y table 406, the tilt of the Y table 406 relative to the sample chamber 112 can be obtained. Then, by adding the tilt of the top table 405 relative to the Y table 406 and the tilt of the Y table 406 relative to the sample chamber 112, the tilt of the top table 405 relative to the sample chamber 112 can be obtained and be used for Abbe error correction.

<Calculation of Yawing and Pitching of Top Table>

Figure 12:
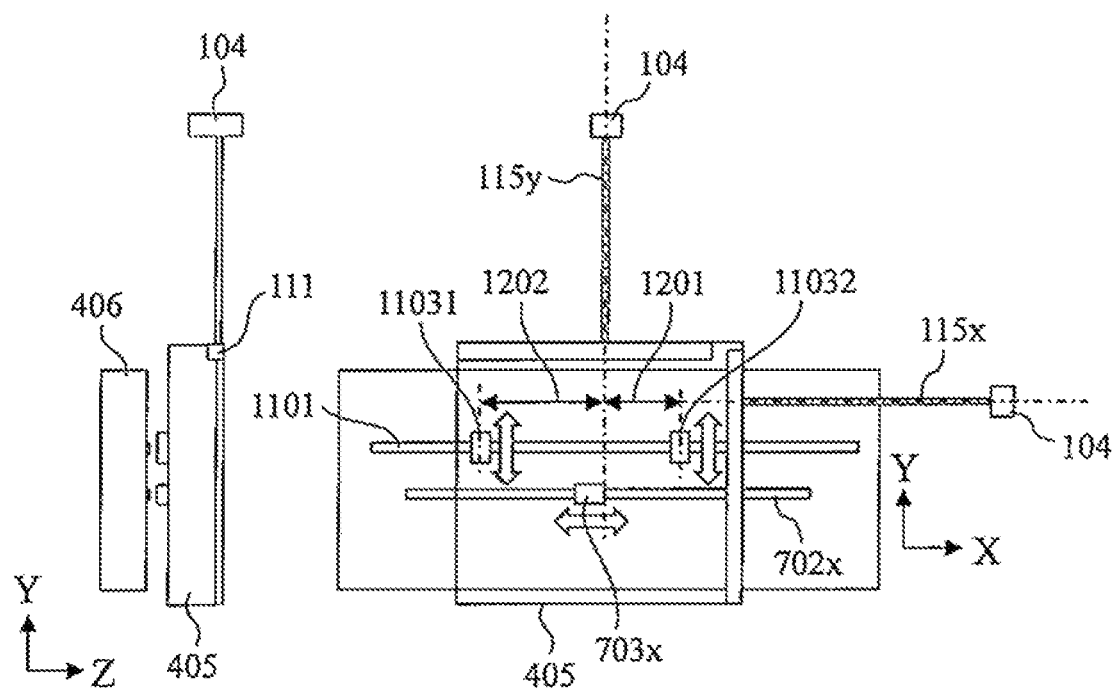
FIG. 12 is a diagram for explaining a configuration of tilt measurement of a top table.
Figure 12:
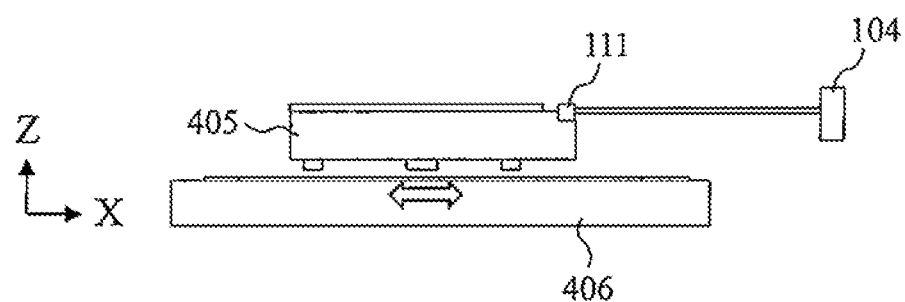

FIG. 12 is a diagram in which only the Y table 406 and the top table 405 are extracted and depicted regarding the arrangement of the laser interferometers 104, the scale 702x for the X-axis, and the perpendicular axis scale 1101 for the X-axis in FIG. 11. Furthermore, FIGS. 13A and 13B are diagrams for explaining yawing calculation of the top table 405.

(i) Yawing of Top Table 405

Figure 13A:
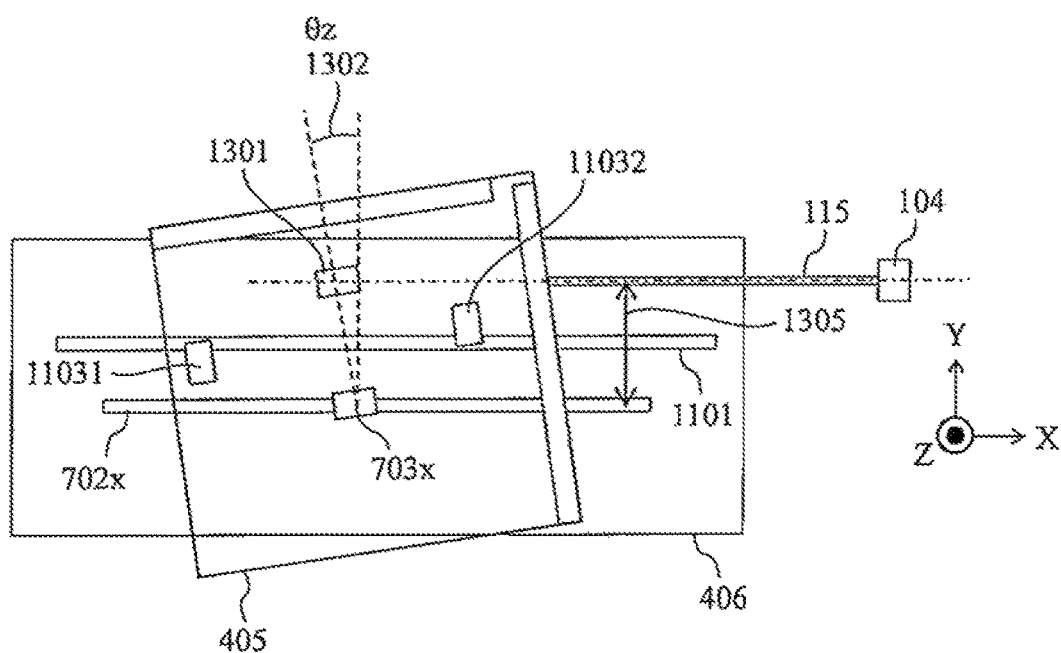
FIGS. 13A and 13B are diagrams for explaining a method of tilt measurement of the top table in a $\theta y$ direction.
Figure 13B:
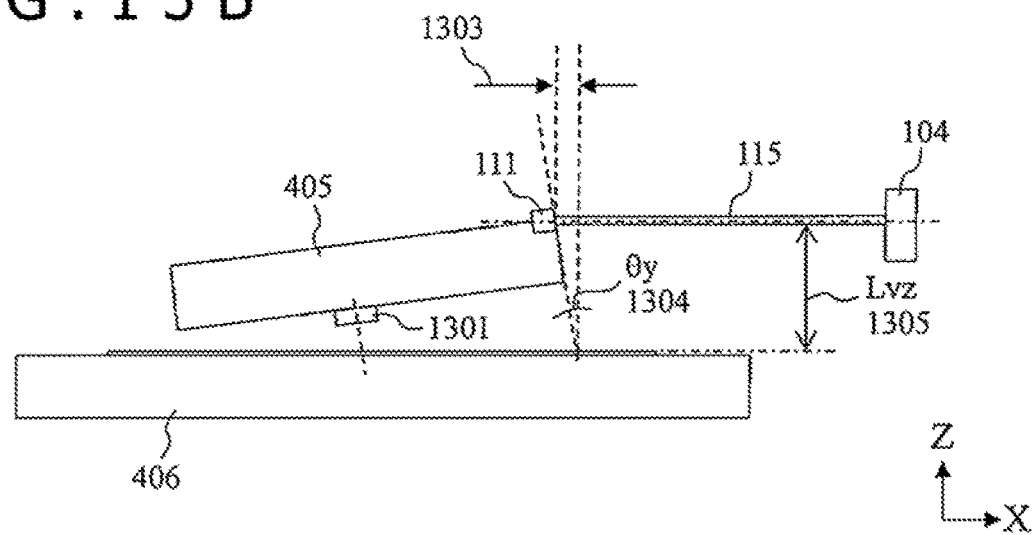

With reference to FIG. 13A, a method for obtaining yawing of the top table 405 will be described. In FIG. 13A, from the difference between reading values or measurement values of two perpendicular axis scale heads 11031 and 11032 for the X-axis and horizontal, or Y-direction, distance 1305, or distance L3 between the scale 702x or X-axis scale and the laser optical axis 115 of the laser interferometer 104, the yawing θz of the top table 405 or X table relative to the Y table 406 can be obtained from expression (6).

$$\theta z=(Vx1-Vx2)/Lvx \qquad (6)$$

In expression (6), Vx1 represents the reading value or measurement value of one perpendicular axis scale head 11031 for the X-axis and Vx2 represents the reading value or measurement value of the other perpendicular axis scale head 11032 for the X-axis.

(ii) Pitching of Top Table

Next, with reference to FIG. 13B, a method for obtaining pitching, or rotation angle around the Y-axis, of the top table 405 will be described. As described above, if the yawing θz exists, an error occurs when pitching θy is obtained by using measurement values by a scale head 703x for the X-axis and the laser beam from the laser interferometer 104. Then, a virtual position 1301 when it is supposed that the scale head 703x in FIG. 13A exists on the laser optical axis 115 is obtained and the pitching θy, or angle 1304, is obtained based on the difference between the virtual position 1301 and the measurement value by the laser. The virtual position 1301 of the scale head 703x is the position resulting from moving the scale head 703x in the Y-direction until the scale head 703x corresponds with the laser optical axis 115. Then, when the yawing θz occurs, it can be understood that how far the virtual position of the scale head 703x is deviated compared with the case in which the yawing θz does not exist by calculating the distance 1305, or distance L3, ×θz. In other words, if the yawing θz exists, when a position measurement value Xscl of the scale head 703x is used, a position Xscl_h of the head virtual position 1301 can be represented as expression (7).

$$Xscl\_h = Xscl + L3 \cdot \theta z \quad (7)$$

Here, L3, that is, distance 1305 between the scale, or X-axis scale, 702x and the laser optical axis 115 of the laser interferometer 104, is a function of the Y-coordinate and the position coordinates of the stage are used.

(iii) Moreover, Referring to FIG. 13B, the Pitching θy is Represented as Expression (8).

$$\theta y = (Xlsr - Xscl\_h)/Lvz \quad (8)$$

Here, Xlsr represents the measurement value of the X-axis direction laser by the laser interferometer 104. Xscl_h represents the virtual position of the scale head 703x obtained by expression (7). Lvz represents the distance 1305 between the scale, or X-axis scale, 702x and the laser optical axis 115 of the laser interferometer 104.

<Calculation of Rolling of Top Table>

Figure 14A:
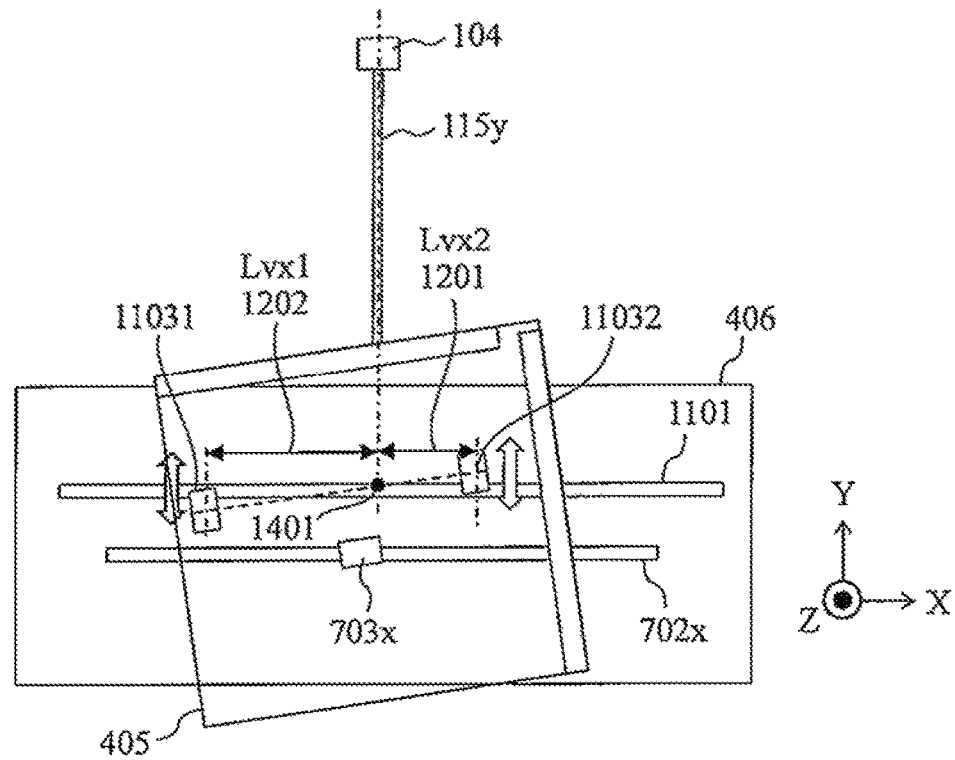
FIGS. 14A and 14B are diagrams for explaining a method of tilt measurement of the top table in a $\theta x$ direction.
Figure 14B:
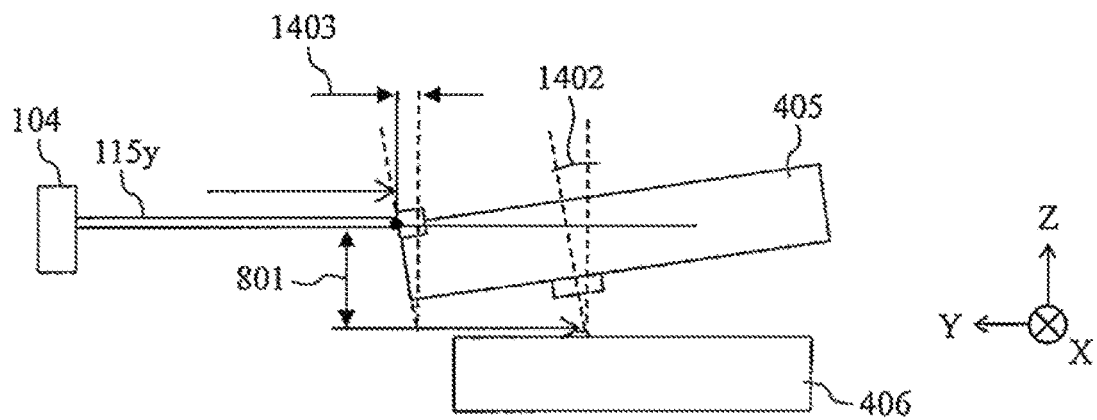

FIGS. 14A and 14B are diagrams for explaining a method for obtaining rolling θx of the top table 405.

(i) As depicted in FIG. 14A, when the reading values, or measurement values, of the two perpendicular axis scale heads 11031 and 11032 for the X-axis are defined as Vx1 and Vx2, respectively, a reading value, or measurement value, Vx_h of the scale head 703x for the X-axis when it is supposed that the scale head 703x for the X-axis exists at a point 1401 directly under the laser from the interferometer, or laser optical axis 115y, 104 can be represented as expression (9).

$$Vx\_h = (Vx1 \cdot Lvx2 + Vx2 \cdot Lvx1)/(Lvx1 + Lvx2) \quad (9)$$

Lvx1 and Lvx2 represent the distances in the X-direction between the perpendicular axis scale heads 11031 and 11032 for the X-axis and the laser optical axis 115y and can be obtained from the X-coordinate of the stage apparatus.

(ii) Furthermore, as depicted in FIG. 14B, when the reading value, or measurement value, of the virtual position of the scale head 703x for the X-axis is defined as Vx_h as described above and the difference 801 in the height between the laser optical axis 115y and the perpendicular axis scale 1101 for the X-axis is defined as Ls2 and the measurement position of the top table 405 by the interferometer, or laser optical axis 115y, 104 is defined as Ylsr, the rolling θx can be represented as expression (10).

$$\theta x = (Ylsr - Vx\_h)/Ls2 \quad (10)$$

(Ylsr−Vx_h) represents the change amount when the top table 405 is tilted, that is, state when the top table 405 is not tilted is deemed as the basis.

<Calculation of Yawing and Pitching of Y Table>

With FIG. 12 to FIG. 14B, a consideration has been made about the displacement including rotation and tilt, of the top table, or X table, 405 placed over the Y table 406. With FIG. 15 to FIG. 18B, a consideration will be made about the displacement of the Y table 406.

(i) Arrangement of Laser Interferometers and Linear Scales

Figure 15:
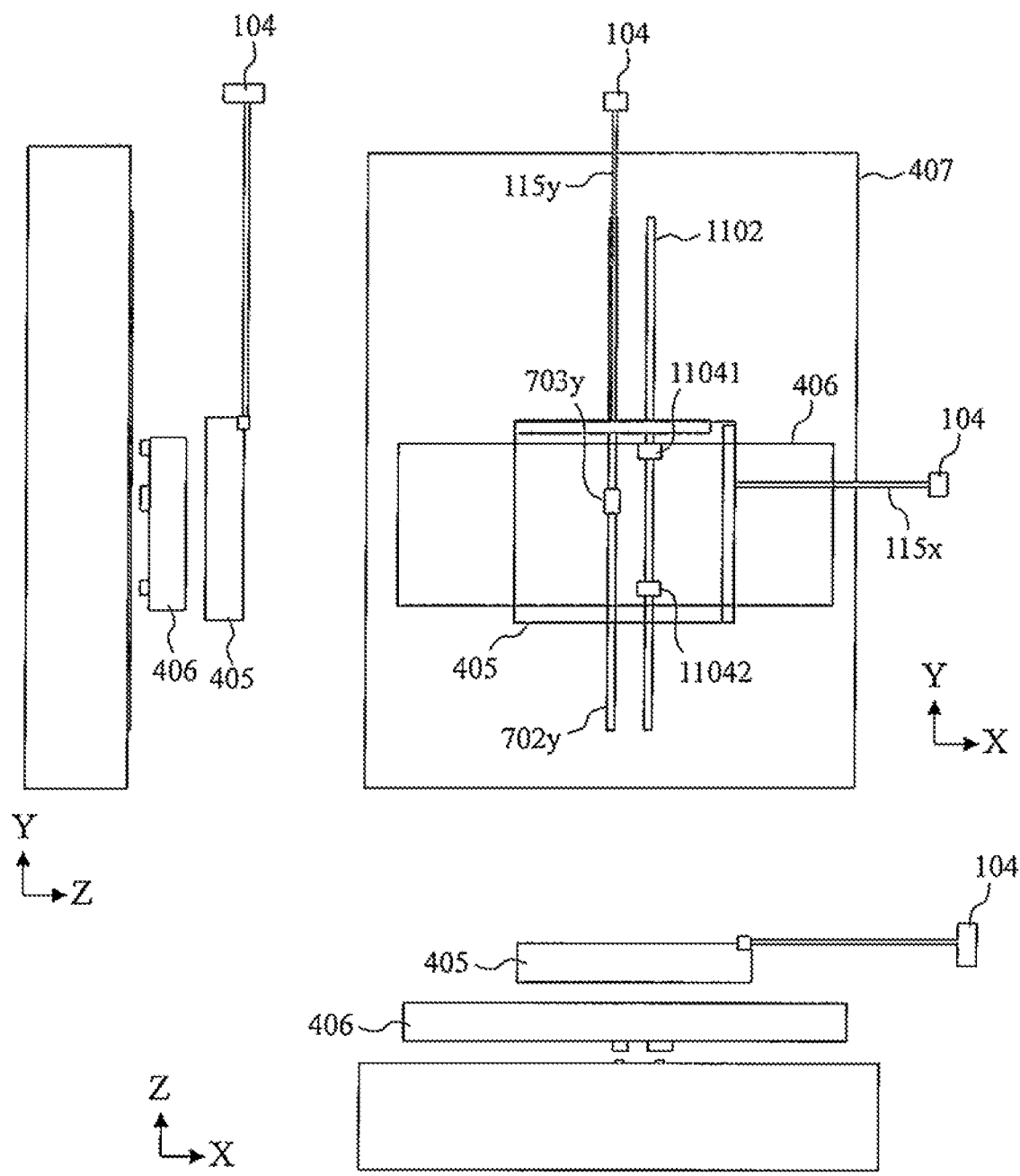
FIG. 15 is a diagram for explaining a configuration for tilt measurement of a Y table.

FIG. 15 is a diagram in which only elements that measure the positional relationship between the sample chamber bottom surface 407 and the Y table 406 are extracted and depicted regarding the arrangement of the laser interferometers 104 and scales, or linear scales, 702y and 1102 for the Y-axis in FIG. 11.

As depicted in FIG. 15, the two laser interferometers 104 are disposed for position measurement of the top table (X table) 405 and the position of the Y table 406 is not measured by the laser interferometer 104. On the sample chamber bottom surface 407, the scale 702y for the Y-axis that measures the position of the Y table 406 in the Y-direction and the perpendicular axis scale 1102 for the Y-axis parallel to the scale 702y for the Y-axis are disposed. Furthermore, on the bottom surface of the Y table 406, a scale head 703y that measures the position of the Y table 406 in the Y-direction and perpendicular axis scale heads 11041 and 11042 for the Y-axis that measure the displacement in the direction, or X-direction, perpendicular to the driving direction of the Y table 406, or Y-direction, are disposed.

(ii) Yawing of Y Table 406

Figure 16:
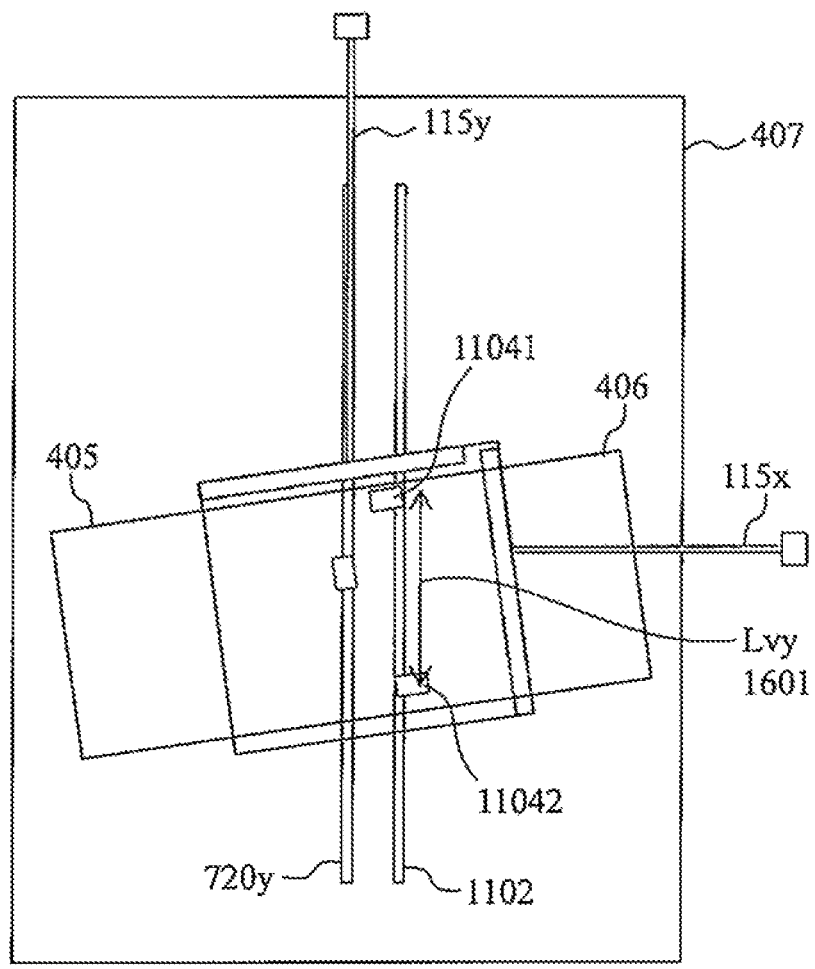
FIG. 16 is a diagram for explaining a method of tilt measurement of the Y table in a θz direction.

FIG. 16 is a diagram for explaining a yawing calculation method of the Y table 406. The Y table 406 does not move in the X-axis direction if the stage apparatus is designed in such a manner that the measurement position by the laser of the laser interferometer 104 and the measurement position in the X-direction by the scale, or linear scale, 702x for the X-axis are set identical because the linear scale for the top table 405 is set on the Y table 406. In other words, even when the Y table 406 is moved, the position with which the laser is irradiated, or position on the X-axis, and the measurement position by the linear scale, or position on the X-axis, are not deviated. Thus, in this case, the need to obtain the yawing ez of the Y table 406 is eliminated and it suffices to consider only pitching θx and rolling θy.

The situation in which the yawing θz needs to be considered is the case in which the measurement position by the laser of the laser interferometer 104 and the measurement position in the X-direction by the scale 702x for the X-axis are not identical. In such a case, from the difference between measurement values, or reading values, of the two perpendicular axis scale heads 11041 and 11042 for the Y-axis, the yawing θz of the Y table 406 with respect to the sample chamber bottom surface 407 can be obtained based on expression (11).

$$\theta z = (Vy1 - Vy2)/Lvy \quad (11)$$

Here, Vy1 and Vy2 represent the measurement values, or reading values, of the two perpendicular axis scale heads 11041 and 11042 for the Y-axis and Lvy represents interval 1601 in the Y-direction between the two perpendicular axis scale heads 11041 and 11042.

(iii) Pitching of Y Table 406

Figure 17:
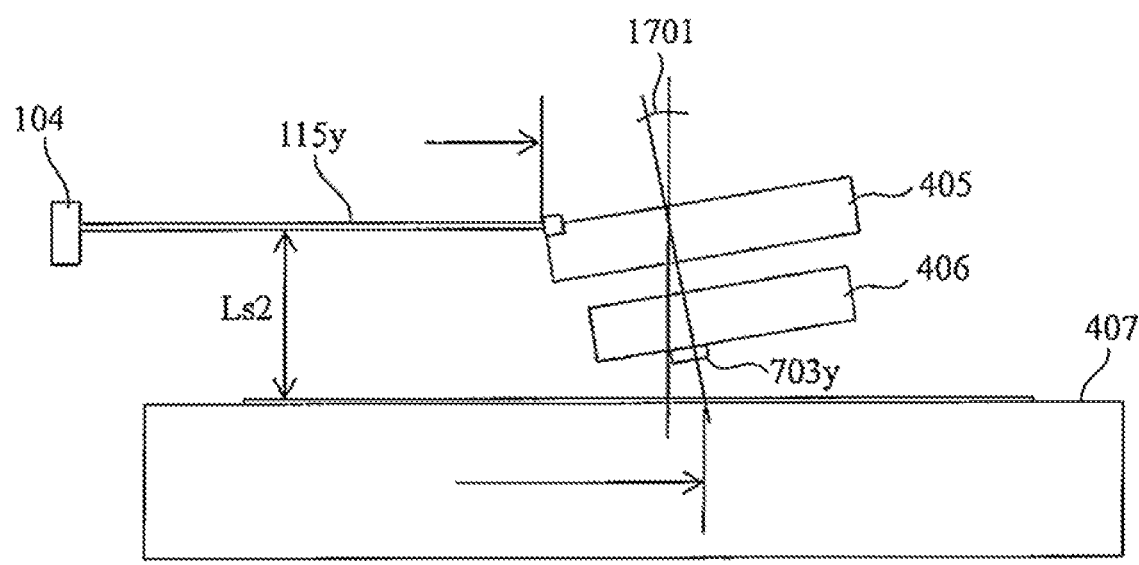
FIG. 17 is a diagram for explaining a method of tilt measurement of the Y table in the θx direction.

FIG. 17 is a diagram for explaining a method for obtaining the pitching θx of the Y table 406.

The pitching θx can be obtained based on expression (12) with use of the difference value between a measurement value Yslr by the laser from the interferometer, or laser optical axis 115y, and a measurement value Yscl_h of the scale head 703y of the scale, or linear scale, 702y for the Y-axis and the height Ls2 of the laser optical axis 115y from the sample chamber bottom surface 407.

$$\theta x = (Ylsr - Yscl\_h)/Ls2 \quad (12)$$

<Calculation of Rolling of Y Table>

Figure 18A:
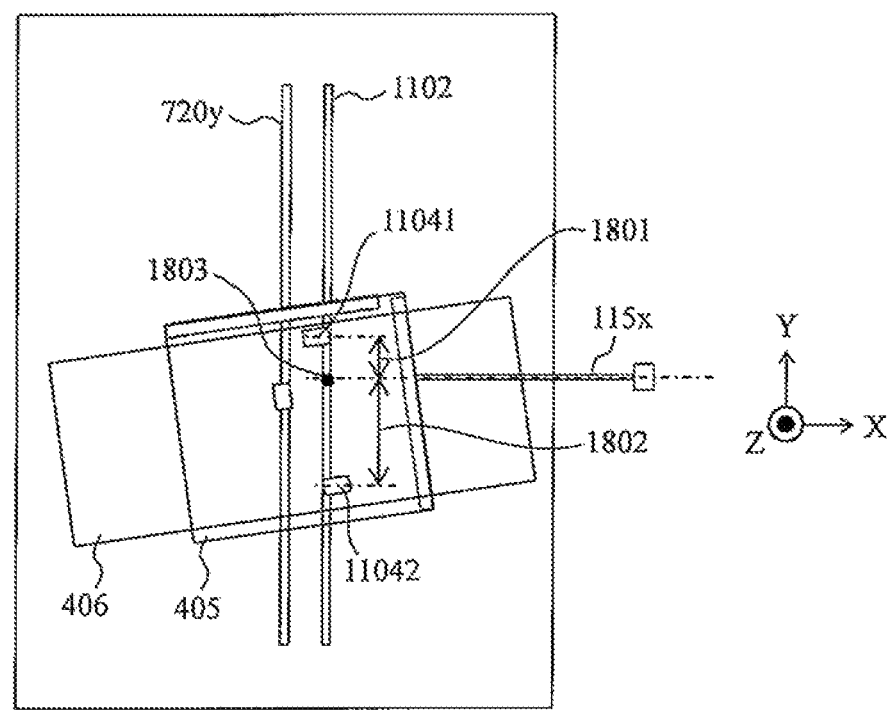
FIGS. 18A and 18B are diagrams for explaining a method of tilt measurement of the Y table in the θy direction.
Figure 18B:
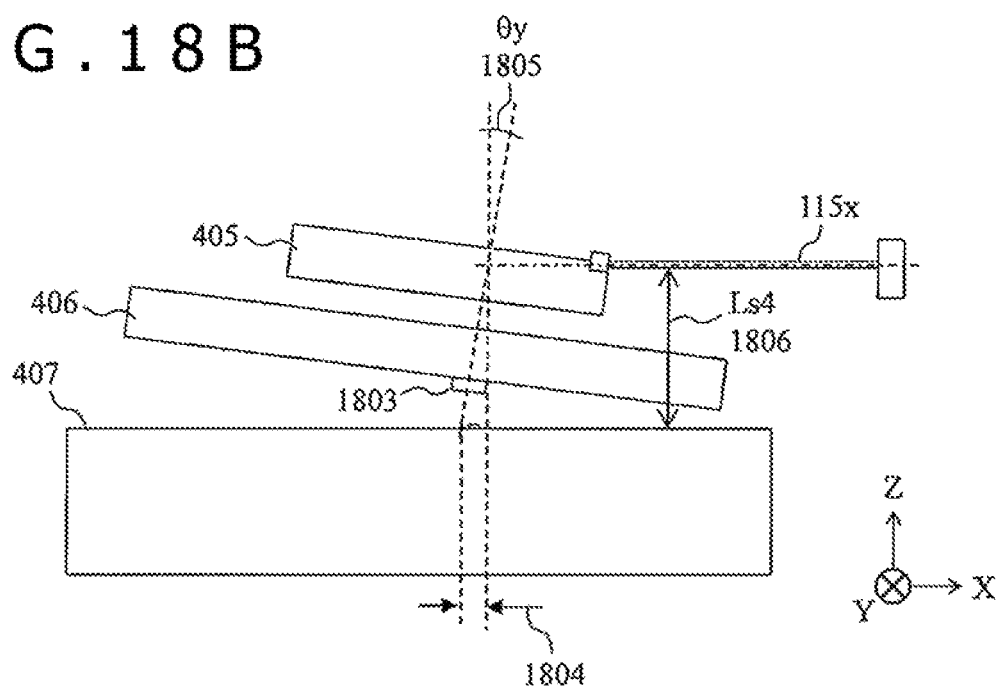

FIGS. 18A and 18B are diagrams for explaining how to obtain the tilt θy of the Y table 406 in the rolling direction with respect to the sample chamber bottom surface 407.

In FIG. 18A, when the measurement values, or reading values, of the two perpendicular axis scale heads 11041 and 11042 for the Y-axis are defined as Vy1 and Vy2, respectively, a measurement value, or reading value, Vy_h, or value of a position 1803 of a virtual head, of the perpendicular axis scale heads 11041 and 11042 for the Y-axis when it is supposed that the perpendicular axis scale heads 11041 and 11042 for the Y-axis exist at the point, or position of the virtual head, 1803 directly under the laser from the interferometer, or optical axis 115x, can be represented as expression (13).

$$Vy\_h = (Vy1 \cdot Lvy2 + Vy2 \cdot Lvy1)/(Lvy1 + Lvy2) \quad (13)$$

Here, Lvy1 and Lvy2 represent the distances in the Y-direction between the perpendicular axis scale heads 11041 and 11042 for the Y-axis and the laser optical axis 115x and these values can be obtained from the Y-coordinate of the stage, or command value given from the operator.

Referring to FIG. 18B, when height, or distance in the Z-direction, 1806 of the laser optical axis 115x from the perpendicular axis scale 1102 for the Y-axis is defined as Ls4, the tilt θy of the Y table 406 can be obtained based on expression (14).

$$\theta y = (Xlsr - Vy\_h)/Ls4 \quad (14)$$

<Tilt of Top Table Relative to Sample Chamber Bottom Surface>

Figure 19:
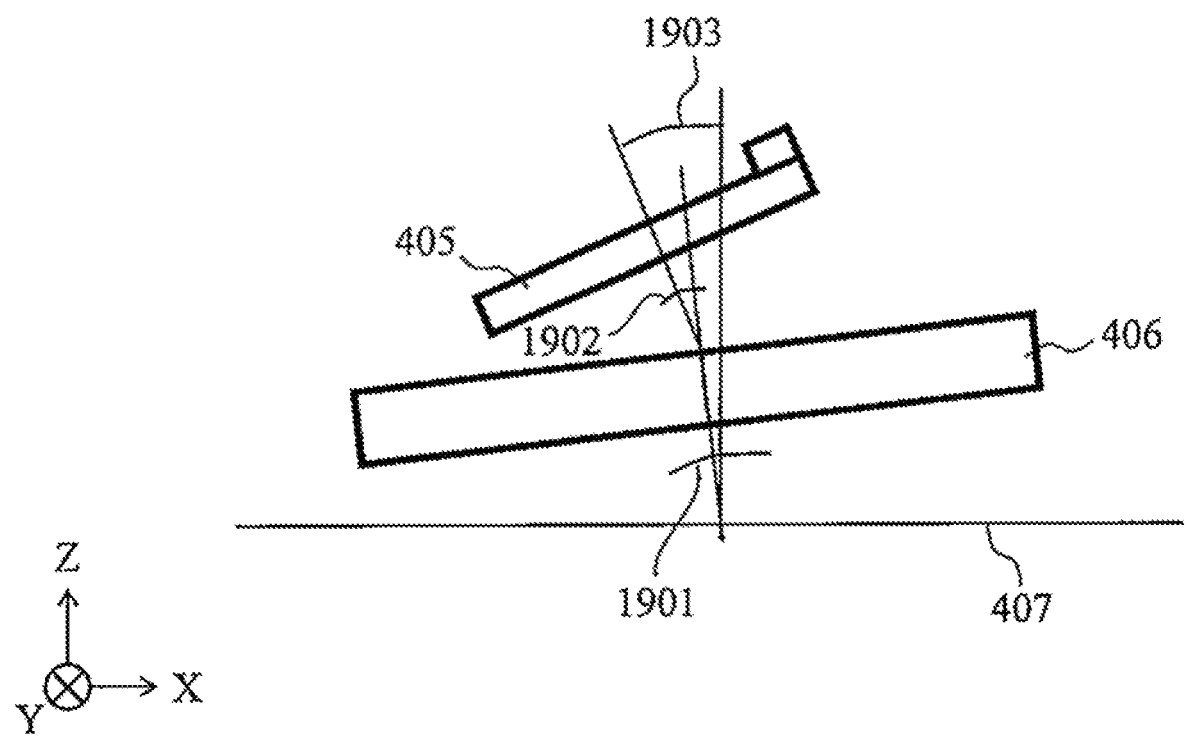
FIG. 19 is a diagram for explaining calculation of the tilt of the top table relative to a sample chamber.

FIG. 19 is a diagram for explaining calculation of the tilt of the top table, or X table, 405 relative to the sample chamber bottom surface 407.

Referring to FIG. 19, the tilt θy of the top table 405 around the Y-axis relative to the sample chamber bottom surface 407 can be expressed by the sum of a tilt θy2 of the Y table 406 relative to the sample chamber bottom surface 407 and a tilt θy1 of the top table 405 relative to the Y table 406 as represented by expression (15).

$$\theta y = \theta y1 + \theta y2 \quad (15)$$

Similarly, the rotation θx around the X-axis can be represented as expression (16).

$$\theta x = \theta x1 + \theta x2 \quad (16)$$

<Error Correction of Scale>

Not only the top table 405 and the Y table 406 but also the scales 702, 702x, 702y, 1101, and 1102 are elements that possibly involve an error. The laser interferometer 104 carries out measurement by using a laser beam, that is, wavelength of light is employed as the basis and measurement is objective, and therefore the possibility that an error is included in the measurement value is extremely low. However, in the case of the scale, personal or mechanical factors are included at the time of fabrication. Therefore, the possibility that an error is included in the measurement value is extremely high and the errors of individual scales are also different, or involving variation. Accordingly, the error of the scale needs to be corrected.

Figure 20A:
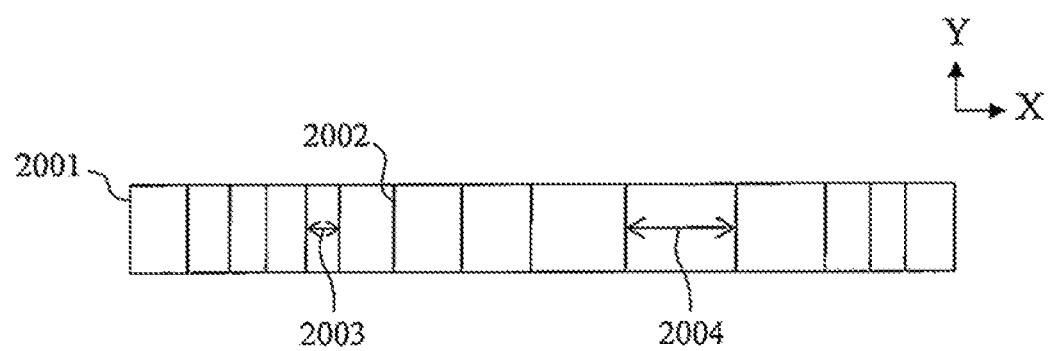
FIGS. 20A and 20B are diagrams for explaining a correction method of a scale error.
Figure 20B:
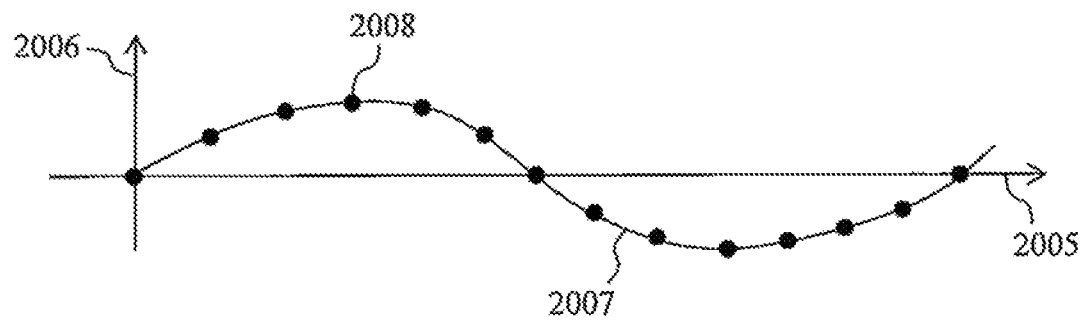

FIGS. 20A and 20B are diagrams for explaining error correction of the scale. As depicted in FIG. 20A, if the interval of a grid 2002 of a scale 2001 that is equivalent to scales 702, 702x, 702y, 1101, and 1102 is not constant, an error occurs in the table position measured by the scale 2001. In other words, it turns out that an error is superimposed on tilt measurement when the tilt is obtained based on the difference from the value of the laser interferometer by using the scale value.

FIG. 20B is a diagram exemplifying the difference between the value of the laser and the value of the scale. In FIG. 20B, the difference, or error, between the value of the laser and the value of the scale with respect to an X-coordinate 2005 is represented on an ordinate axis 2006. Then, points 2008, or points of correction map, are plotted, at arbitrary intervals, on an error waveform 2007 of the scale when the value of the laser is employed as the basis and an error map of the scale with respect to the X-coordinate is created. By correcting the measurement values of individual scales by using this error map, the tilt of the tables 405 and 406 can be obtained with high accuracy even when an error exists in the measurement value of the individual scales.

<Tilt Measurement Accuracy when Table Involves Warpage>

Figure 21A:
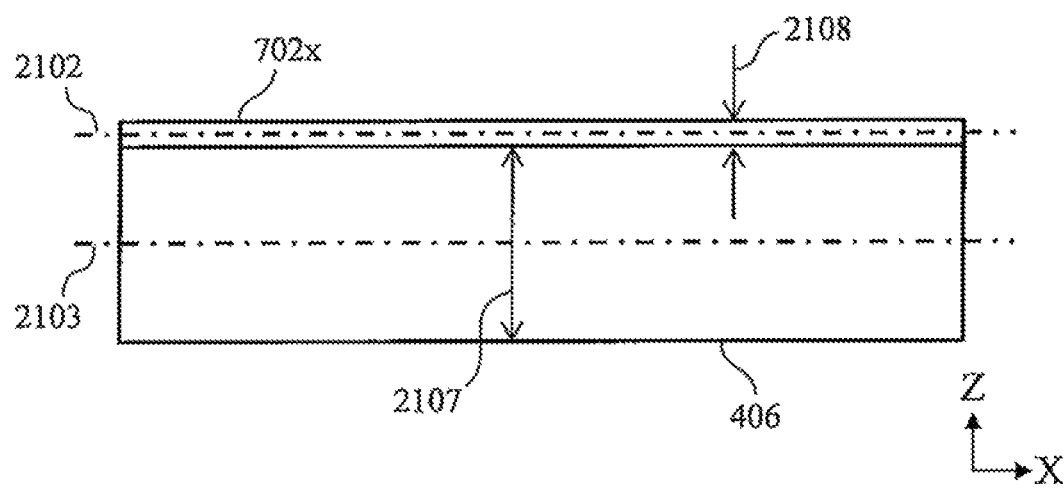
FIGS. 21A and 21B are diagrams for explaining that an error due to warpage of the scale is minute.
Figure 21B:
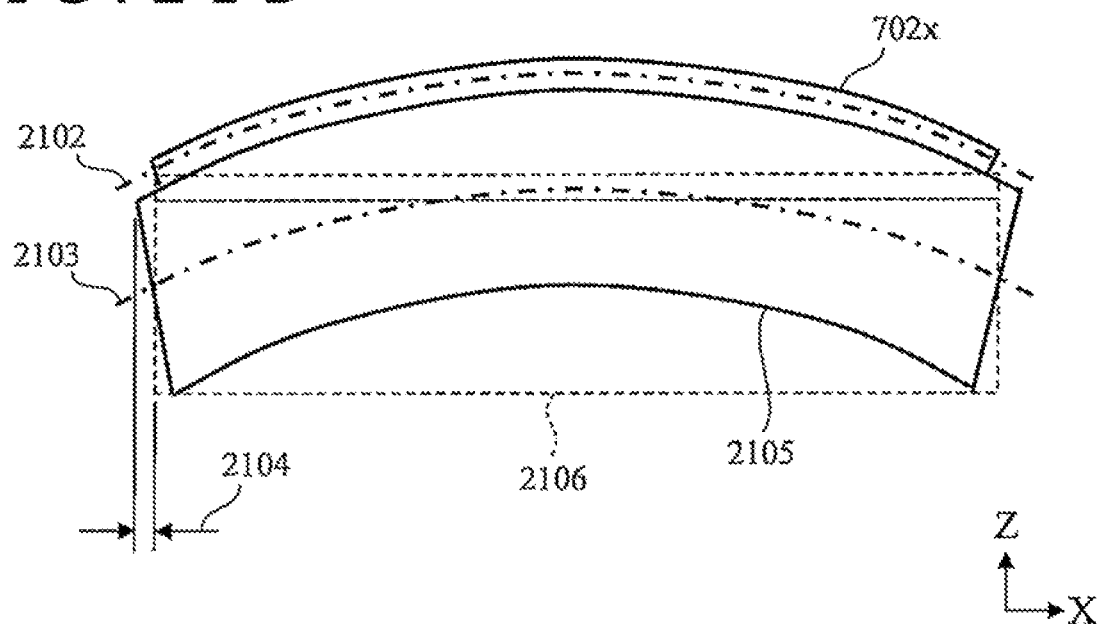

FIGS. 21A and 21B are diagrams for explaining that tilt measurement can be carried out with high accuracy even when the table including top table 405 and Y table 406 involves warpage.

As depicted in FIG. 21A, for example, it can be understood that the measurement value by the scale 702x accurately represents the position of the Y table 406 when the Y table 406 does not involve warpage. In FIG. 21A, appearance when the Y table 406 and the scale 702 for the X-axis in the configuration of FIG. 7 are seen from the Y-direction is depicted.

On the other hand, as depicted in FIG. 21B, if the Y table 406 warps from an original shape 2106 to a shape 2105 due to thermal deformation, the Y table 406 exhibits behavior in which the Y table 406 expands on the upper side of a neutral axis, or center of bending, 2103 of the Y table 406 and contracts on the lower side. Furthermore, the scale 702x for the X-axis also similarly warps and expansion and contraction occur on the upper and lower sides of a neutral axis, or center of bending of the scale, 2102 of the scale 702x for the X-axis.

However, thickness 2108 of the scale 702x for the X-axis is smaller relative to thickness 2107 of the Y table 406. Therefore, the expansion of the scale 702x for the X-axis is so small as to be ignorable and does not affect the above-described tilt measurement. To enhance this effect, without fixing the scale 702x for the X-axis and the Y table 406 by bolts or the like across the whole length of the scale 702x for the X-axis in the X-direction, the fixing place may be limited through use of a plate spring or the like and fixing with flexibility of sliding in the X-direction may be employed.

<Operation Main Entity of Arithmetic Operation>

In the present embodiment, for example, the controller 109 of a charged particle beam apparatus, or a critical-dimension SEM, acquires measurement values from the laser interferometers 104 and the respective scale heads 703, 703x, 703y, 11031, 11032, 11041, and 11042 and executes arithmetic processing based on the above-described expressions (1) to (15) to calculate the values of the yawing θz, the pitching θx, and the rolling θy. Then, the controller 109 corrects the Abbe error of the stage apparatus or the charged particle beam apparatus based on the calculated values of the yawing θz, the pitching θx, and the rolling θy.

Furthermore, the controller 109 executes also the above-described error correction of the scale.

(2) Second Embodiment

Figure 22:
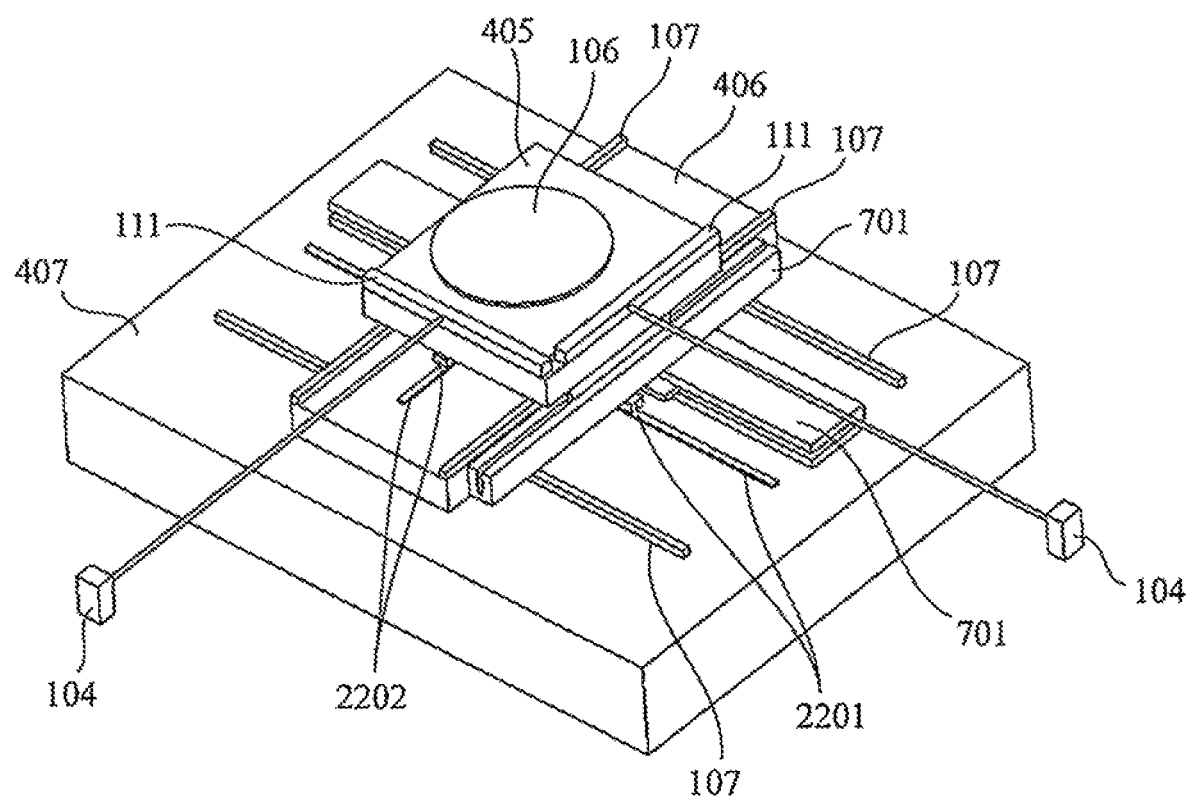
FIG. 22 is a diagram depicting a configuration example when the perpendicular axis scale and the scale of a driving axis are integrated by using a two-axis scale.

FIG. 22 is a diagram depicting a configuration example when the perpendicular axis scale and the scale of the driving axis are integrated by using a two-axis scale.

In the configuration depicted in FIG. 22, scales 1101 and 1102 and scales 702$x$ and 702$y$ in FIG. 11 are integrated to a scale 2201 and a scale 2202 that are each capable of two-axis measurement. Due to this, the number of mounted scales is reduced from four to two and the weight of the stage can be reduced.

(3) Third Embodiment

It is also possible to replace the laser interferometer 104 used in the first embodiment by a planar scale that enables measurement in the XY-directions.

(4) Summarization of Embodiment (i) In the present embodiment, it is explained that the Abbe error of both of the X-table and the Y-table is corrected in the sample table including the X table and the Y table. However, the Abbe error about at least either one table may be corrected.

The stage apparatus according to the present embodiment includes: a first drive mechanism that moves a sample table, for example X table, in a first direction, for example X-direction; a position measurement element, for example laser interferometer, that measures the position in the first direction that is the driving direction of the sample table; a scale element that includes a linear scale and a scale head and that has a scale measurement axis that is parallel to a first measurement axis, for example laser optical axis of the laser interferometer, in the first direction based on the position measurement element and is different from the first measurement axis in height and measures the position of the sample table in the first direction, and a controller that calculates the orientation of the sample table, for example yawing, pitching; and rolling of the X table, by using a measurement value by the position measurement element and a measurement value by the scale element and corrects the Abbe error of the sample table. Employing such a configuration makes it possible to reduce the Abbe error of the stage apparatus without increasing the size of the stage apparatus.

(ii) When the position measurement element is formed of a laser interferometer for example, the position measurement element includes a first laser interferometer that measures the position of the sample table in the first direction, for example X-direction, by irradiating a first mirror disposed on the sample table, for example X table, with laser light and receiving reflected light from the first mirror. Furthermore, the scale element includes: a scale attached to a placement surface, for example upper surface of the Y table, over which the sample table, for example X table, is placed in such a manner as to keep a predetermined distance from the sample table; and a scale head that reads the value of the scale. In this case, the controller calculates the orientation of the sample table, for example X table, by using the change amount of the difference between the measurement value by the position measurement element and the measurement value by the scale element. The controller calculates the yawing of the sample table, or X table, and calculates the pitching of the sample table by using the calculated yawing. As above, in the present embodiment, the orientation is calculated by using two kinds of position measurement means. The scale element including a linear scale and a scale head is available at very low cost compared with the interferometer. Therefore, although the scale element enables correction of the Abbe error, it becomes possible to remarkably suppress cost increase of the stage apparatus compared with the case of adding the interferometer.

For example, in the case of calculating the yawing of the sample table, or X table, the scale element may be allowed to have two or more scale heads that measure the displacement of the sample table, or X table, in a second direction, or Y-direction, perpendicular to the first direction, or X-direction. In this case, the controller calculates the yawing by using measurement values of the two or more scale heads. Because displacement including rotation and torsion in the direction, or Y-direction, perpendicular to the movement direction, or X-direction, can be measured as above, it becomes possible to accurately calculate the yawing.

(iii) When the sample table is composed of a first table, or X table, driven in the first direction, or X-direction, and a second table, or Y table, that moves in the second direction, or Y-direction, perpendicular to the first direction, the first table, or X table, is placed to move above the second table, or Y table. In addition, the position measurement element further includes a second laser interferometer that measures the position of the sample table in the second direction, or Y-direction, perpendicular to the first direction by irradiating a second mirror that is disposed on the sample table and is different from the first mirror with laser light and receiving reflected light from the second mirror. Furthermore, the scale element includes: plural scales for the first table attached to a first surface, which is a placement surface of the X table or an upper surface, of the second table, or Y table, in such a manner as to keep a predetermined distance from the first table, or X table, and plural scale heads for the first table that read values of the plural scales. The controller calculates displacement in the first direction and displacement in the second direction regarding the first table by using measurement values of the plural scale heads for the first table and calculates the Abbe error of the first table. Moreover, the second table, or Y table, is placed to move above the disposing surface of the stage apparatus, for example sample chamber bottom surface. In this case, the scale element further includes plural scales for the second table attached to the disposing surface of the stage apparatus, or the sample chamber bottom surface, in such a manner as to keep a predetermined distance from the second table, or Y table, and plural scale heads for the second table that read values of the plural scales. The controller calculates displacement in the first direction and displacement in the second direction regarding the second table by using measurement values of the plural scale heads for the second table and calculates the Abbe error of the second table. Furthermore, the controller calculates the Abbe error of the sample table by adding the Abbe error of the first table and the Abbe error of the second table. By doing this, with avoidance of increase in the size of the stage apparatus, the Abbe error attributed to both of the X-table and the Y-table can be corrected.

(iv) The controller removes an error value from the measurement value of the scale element by using a correction map that holds the error value with respect to a laser value of the scale element, and takes the difference between the laser value and the measurement value of the scale element from which the error value has been removed to calculate the orientation of the sample table. Possibly a human factor is included in the scale element and an error is included in the scale element itself due to this human factor. For this reason, by eliminating the error included in the scale element itself, Abbe error correction can be carried out with higher accuracy.

What is claimed is:

1. A stage apparatus comprising:
a sample table having a first table movable in a first direction and a second table moveable in a second direction, which is perpendicular to the first direction, the first table disposed above the second table;
a position measurement element having a first measurement axis configured to measure a position in the first direction that is a driving direction of the sample table, and a first mirror disposed on a top surface of the first table;
a first scale disposed on a top surface of the second table and extending in the first direction, having a scale measurement axis that is parallel to the first measurement axis in the first direction based on the position measurement element, and configured to measure the position of the sample table in the first direction; and
a controller configured to calculate an orientation of the sample table based on a measurement value by the position measurement element and a measurement value by the first scale and correct an Abbe error of the sample table,
wherein the first measurement axis is disposed at a different height than the scale measurement axis of the scale element in a third direction, which is perpendicular to the first direction and the second direction, and
wherein the top surface of the first table is devoid of a scale.

2. The stage apparatus according to claim 1, further comprising:
a first scale head disposed on a bottom surface of the first table,
wherein the position measurement element includes a first laser interferometer that measures the position of the sample table in the first direction by irradiating the first mirror disposed on the sample table with laser light and receiving reflected light from the first mirror.

3. The stage apparatus according to claim 2, wherein the controller is configured to calculate the orientation of the sample table by using a change amount of a difference between the measurement value by the position measurement element and the measurement value by the first scale.

4. The stage apparatus according to claim 3, wherein the controller is configured to calculate a yaw of the sample table and a pitch of the sample table by using the calculated yaw.

5. The stage apparatus according to claim 4, further comprising:
at least a second scale head, in addition to the first scale head, that measure displacement of the sample table in the second direction perpendicular to the first direction,
wherein the controller is configured to calculate the yaw by based on measurement values of the two or more scale heads.

6. The stage apparatus according to claim 2,
wherein the position measurement element further includes a second laser interferometer that measures a position of the sample table in the second direction perpendicular to the first direction by irradiating a second mirror that is disposed on the top surface of the first sample table and is different from the first mirror with laser light and receiving reflected light from the second mirror,
wherein the scale element includes:
a plurality of first scales for the first table, attached to the top surface of the second table, including the first scale, in such a manner as to keep a predetermined distance from the first table, and
a plurality of first scale heads for the first table that read values of the plurality of first scales, and
wherein the controller is configured to calculate displacement in the first direction and displacement in the second direction regarding the first table by using measurement values of the plurality of scale heads for the first table and calculates an Abbe error of the first table.

7. The stage apparatus according to claim 6, further comprising:
sample chamber having a bottom surface;
a plurality of second scales for the second table attached to a top surface of the bottom surface of the sample chamber; and
a plurality of second scale heads for the second table that read values of the plurality of scales, and
wherein the controller is configured to calculate a displacement in the first direction and a displacement in the second direction regarding the second table based on measurement values of the plurality of scale heads for the second table and calculates an Abbe error of the second table.

8. The stage apparatus according to claim 7, wherein the controller is configured to calculate the Abbe error of the sample table by adding the Abbe error of the first table and the Abbe error of the second table.

9. The stage apparatus according to claim 2, wherein the controller is configured to remove an error value from the measurement value of the scale element by using a correction map that holds the error value with respect to a laser value of the scale element, and calculate the orientation of the sample table based on a difference between the laser value and the measurement value of the scale element from which the error value has been removed.

10. The stage apparatus according to claim 1, wherein the position measurement element includes a planar scale that enables measurement in two-axis directions.

11. A charged particle beam apparatus comprising:
a charged particle beam lens barrel for irradiating a sample with a charged particle beam; and
the stage apparatus according to claim 1.

* * * * *